(12) United States Patent
Teraki

(10) Patent No.: US 9,784,506 B2
(45) Date of Patent: Oct. 10, 2017

(54) REFRIGERANT PIPE ATTACHMENT STRUCTURE

(75) Inventor: Junichi Teraki, Shiga (JP)

(73) Assignee: DAKIN INDUSTRIES, LTD., Osaka-Shi (JP)

(*) Notice: Subject to any disclaimer, the term of this patent is extended or adjusted under 35 U.S.C. 154(b) by 506 days.

(21) Appl. No.: 14/233,432

(22) PCT Filed: Jun. 27, 2012

(86) PCT No.: PCT/JP2012/004167
§ 371 (c)(1),
(2), (4) Date: Jan. 17, 2014

(87) PCT Pub. No.: WO2013/011636
PCT Pub. Date: Jan. 24, 2013

(65) Prior Publication Data
US 2014/0138073 A1    May 22, 2014

(30) Foreign Application Priority Data

Jul. 20, 2011 (JP) .................................. 2011-158834

(51) Int. Cl.
*F28F 9/04* (2006.01)
*F28F 9/013* (2006.01)
(Continued)

(52) U.S. Cl.
CPC ................ *F28F 9/013* (2013.01); *F24F 1/24* (2013.01); *F25B 31/006* (2013.01);
(Continued)

(58) Field of Classification Search
CPC ........ F24F 1/24; F25B 31/006; F25D 19/006; F28F 9/013; F28F 9/0131; F28F 2265/26;
(Continued)

(56) References Cited

U.S. PATENT DOCUMENTS 2,517,411 A * 8/1950 Patterson ................ F25B 39/02
                                                       165/133
2,560,486 A * 7/1951 Shears ..................... F16L 3/227
                                                       24/338

(Continued)

FOREIGN PATENT DOCUMENTS

EP    2 840 603 A1    2/2015
EP    2 844 050 A1    3/2015
(Continued)

OTHER PUBLICATIONS

Partial English machine translation of JP-1-145136-U dated Oct. 5, 1989.

(Continued)

*Primary Examiner* — Etsub Berhanu
*Assistant Examiner* — Jose O Class-Quinones
(74) *Attorney, Agent, or Firm* — Birch, Stewart, Kolasch & Birch, LLP

(57) ABSTRACT

A refrigerant pipe attachment structure is provided, in which it can be ensured that a refrigerant pipe is held and thermal resistance between the refrigerant pipe and a heat transfer member can be sufficiently reduced. A heat transfer member formed with an elongated groove into which a refrigerant pipe is fitted and thermally contacting a cooling target is provided. An elastic member formed in an elongated plate shape extending along an extension direction of the refrigerant pipe and including a pipe-facing part facing the refrigerant pipe is provided. A pressing mechanism configured to press the elastic member toward the heat transfer member is provided.

13 Claims, 19 Drawing Sheets

(51) Int. Cl.
  *H01L 23/473* (2006.01)
  *H01L 23/40* (2006.01)
  *F25D 19/00* (2006.01)
  *F25B 31/00* (2006.01)
  *F24F 1/24* (2011.01)

(52) U.S. Cl.
  CPC ............ *F25D 19/006* (2013.01); *H01L 23/40* (2013.01); *H01L 23/473* (2013.01); *H01L 23/4006* (2013.01); *H01L 2924/0002* (2013.01)

(58) Field of Classification Search
  CPC ............... F28F 2225/04; F28F 2240/00; F28F 2265/30; F28F 2265/32; F28F 2275/08
  USPC .................................................. 165/82, 178
  See application file for complete search history.

(56) References Cited

U.S. PATENT DOCUMENTS

| | | | | |
|---|---|---|---|---|
| 3,599,915 A | * | 8/1971 | Soltysik | F16L 3/237 248/68.1 |
| 4,235,285 A | * | 11/1980 | Johnson | H01L 23/4093 165/169 |
| 7,426,112 B2 | * | 9/2008 | Chi-Wei | H01L 23/4093 165/104.26 |
| 7,515,423 B2 | * | 4/2009 | Peng | H05K 7/20936 165/104.21 |
| 2007/0195500 A1 | * | 8/2007 | Cheng | F28D 15/0233 361/697 |
| 2009/0205810 A1 | | 8/2009 | Wan et al. | |
| 2010/0020501 A1 | * | 1/2010 | Li | H01L 23/4006 361/710 |
| 2011/0079033 A1 | * | 4/2011 | Okuda | F24F 1/22 62/259.2 |
| 2011/0299243 A1 | * | 12/2011 | Yamaura | H05K 7/20927 361/688 |

FOREIGN PATENT DOCUMENTS

| | | |
|---|---|---|
| EP | 2 857 764 A1 | 4/2015 |
| JP | 57-42155 A | 3/1982 |
| JP | 63-136656 A | 6/1988 |
| JP | 1-145136 U | 10/1989 |
| JP | 2001-68887 A | 3/2001 |
| JP | 2003-247765 A | 9/2003 |
| JP | 2010-114115 A | 5/2010 |
| JP | 2011-99577 A | 5/2011 |

OTHER PUBLICATIONS

Partial English machine translation of JP-57-42155-A dated Mar. 9, 1982.
International Search Report Issued in PCT/JP2012/004167, mailed on Aug. 7, 2012.
Supplemental partial English translation of JP-57-42155-A dated Mar. 9, 1982.

* cited by examiner

REFRIGERANT PIPE ATTACHMENT STRUCTURE

TECHNICAL FIELD

The present disclosure relates to a refrigerant pipe attachment structure in a cooling structure for cooling a cooling target with refrigerant flowing through a refrigerant pipe.

BACKGROUND ART

A cooling mechanism configured to cool a cooling target with refrigerant flowing through a refrigerant pipe has been conventionally known. For example, Patent Document 1 discloses a cooling structure in which a cooling target is an electric component of an air conditioner.

Specifically, the cooling structure of Patent Document 1 includes a heat transfer member in which a groove having an arc-shaped bottom surface is formed, and a holding member configured to press a refrigerant pipe against the heat transfer member. The holding member is, e.g., an elastic clip with a U-shaped cross section opening to a side close to the refrigerant pipe. The refrigerant pipe is inserted into the elastic clip through the opening thereof. Due to elastic force of the elastic clip, the refrigerant pipe is biased toward the heat transfer member. As a result, the refrigerant pipe is pressed against the heat transfer member, and thermal resistance between the refrigerant pipe and the heat transfer member is reduced.

CITATION LIST

Patent Document

PATENT DOCUMENT 1: Japanese Unexamined Patent Publication No. 2010-114115

SUMMARY OF THE INVENTION

Technical Problem

The holding member of Patent Document 1 is formed as the foregoing elastic clip in such a manner that a long plate extending in a direction perpendicular to the refrigerant pipe is bent into a U-shape. However, in such a holding member, the area of a pressing part at which the refrigerant pipe is pressed against the heat transfer member is relatively small. As a result, there is a disadvantage that pressing of the refrigerant pipe with insufficient force results in reduction in refrigerant pipe attachment strength and insufficient reduction in thermal resistance between the refrigerant pipe and the heat transfer member.

The present disclosure has been made in view of the foregoing, and aims to propose a refrigerant pipe attachment structure in which a refrigerant pipe can be firmly held and thermal resistance between the refrigerant pipe and a heat transfer member can be sufficiently reduced.

Solution to the Problem

A first aspect of the invention is intended for a refrigerant pipe attachment structure for cooling a cooling target. The refrigerant pipe attachment structure includes a heat transfer member (70) formed with an elongated groove (72) into which a refrigerant pipe (15) is fitted and thermally contacting a cooling target (63); an elastic member (80) formed in an elongated plate shape extending along an extension direction of the refrigerant pipe (15) and including a pipe-facing part (82) facing the refrigerant pipe (15); and a pressing mechanism (90) configured to press the elastic member (80) toward the heat transfer member (70).

In the first aspect of the invention, the refrigerant pipe (15) is held between the groove (72) of the heat transfer member (70) and the pipe-facing part (82) of the elastic member (80). Heat generated from the cooling target (63) is transmitted to the heat transfer member (70) and the refrigerant pipe (15) in this order, and then is applied to refrigerant flowing through the refrigerant pipe (15). Thus, the cooling target (63) is cooled.

The heat transfer member (70) of the present disclosure is formed in the elongated plate shape extending along the extension direction of the refrigerant pipe (15), and, accordingly, the groove (72) of the elastic member (80) is also formed in the elongated shape. Thus, when the elastic member (80) is pressed toward the heat transfer member (70) by the pressing mechanism (90), a contact area between the elastic member (80) and the refrigerant pipe (15) and a contact area between the refrigerant pipe (15) and the groove (72) are relatively increased.

A second aspect of the invention is intended for the refrigerant pipe attachment structure of the first aspect of the invention, in which at least one bent part (86) extending along the extension direction of the refrigerant pipe (15) is formed in the elastic member (80).

In the elastic member (80) of the second aspect of the invention, the bent part (86) extending in the extension direction of the refrigerant pipe (15) is formed. Thus, the elastic member (80) has stiffness greater in a longitudinal direction than in a width direction. As a result, the elastic member (80) has sufficient stiffness in the longitudinal direction, whereas has a certain degree of elasticity in the width direction.

A third aspect of the invention is intended for the refrigerant pipe attachment structure of the first or second aspect of the invention, in which the pipe-facing part (82) of the elastic member (80) is formed in a flat plate shape.

In the elastic member (80) of the third aspect of the invention, the pipe-facing part (82) facing the refrigerant pipe (15) is formed in the flat plate shape. Thus, the pipe-facing part (82) pressed by the pressing mechanism (90) is substantially in line contact with the refrigerant pipe (15) in the extension direction thereof.

A fourth aspect of the invention is intended for the refrigerant pipe attachment structure of any one of the first to third aspects of the invention, in which the groove (72) includes a plurality of grooves (72) which are formed in the heat transfer member (70), and the refrigerant pipe (15) includes a plurality of refrigerant pipes (15), each of which is fitted into a corresponding one of the grooves (72), and the elastic member (80) is formed in a single plate shape extending over the grooves (72).

In the heat transfer member (70) of the fourth aspect of the invention, each groove (72) is formed for a corresponding one of the refrigerant pipes (15). The elastic member (80) is formed in the plate shape extending over the grooves (72). When the elastic member (80) is pressed toward the heat transfer member (70) by the pressing mechanism (90), the refrigerant pipes (15) are held between the elastic member (80) and the heat transfer member (70).

A fifth aspect of the invention is intended for the refrigerant pipe attachment structure of the fourth aspect of the invention, in which the grooves (72) include two grooves (72) formed in the heat transfer member (70), the pipe-facing part (82) of the elastic member (80) includes two pipe-facing parts (82) each facing a corresponding one of the two grooves (72), and the elastic member (80) further includes a pressing target (84) formed between the two grooves (72) and pressed against the pressing mechanism (90).

In the fifth aspect of the invention, each refrigerant pipe (15) is held between the groove (72) of the heat transfer member (70) and the pipe-facing part (82) of the elastic member (80). The pressing mechanism (90) presses the pressing target (84) of the elastic member (80) formed between the pipe-facing parts (82) against the heat transfer member (70). Thus, pressing force relatively equally acts on the refrigerant pipes (15).

A sixth aspect of the invention is intended for the refrigerant pipe attachment structure of any one of the first to fifth aspects of the invention, in which a heat transfer enhancing material (78) configured to enhance heat transfer is interposed between the groove (72) of the heat transfer member (70) and the refrigerant pipe (15).

In the sixth aspect of the invention, the heat transfer enhancing material (78) for enhancing the heat transfer is provided in the groove (72) of the heat transfer member (70). As a result, thermal resistance between the heat transfer member (70) and the refrigerant pipe (15) is reduced.

A seventh aspect of the invention is intended for the refrigerant pipe attachment structure of any one of the first to sixth aspects of the invention, in which an engagement groove (100) is formed in the heat transfer member (70), and the pressing mechanism (90) includes an engagement part (96, 123) detachably engaged with the engagement groove (100), a displaceable gripping part (94, 125) disposed outside the elastic member (80), and a pressing part (93, 124a) which is, by displacement of the gripping part (94, 125), displaceable between a first position at which the elastic member (80) is pressed and a second position at which the elastic member (80) is released.

In the seventh aspect of the invention, since the engagement part of the pressing mechanism (90) is engaged with the engagement groove (100) of the heat transfer member (70), the pressing mechanism (90) is detachably attached to the heat transfer member (70). Moreover, a user operates the gripping part (94, 125) to displace the pressing part (93, 124a) between the first position and the second position, thereby easily switching between pressing of the elastic member (80) and releasing of the elastic member (80).

An eighth aspect of the invention is intended for the refrigerant pipe attachment structure of any one of the first to seventh aspects of the invention, in which a slit (80a) is formed in the elastic member (80).

Since the slit (80a) is formed in the foregoing configuration, it can be ensured that the elastic member (80) is along straight pipe parts (16). Thus, the slit (80a) easily equalizes pressure applied to the refrigerant pipe (15) from the elastic member (80).

A ninth aspect of the invention is intended for the refrigerant pipe attachment structure of any one of the first to eighth aspects of the invention, in which the elastic member (80) includes a plurality of elastic members (80) arranged in the extension direction of the refrigerant pipe (15).

Since the plurality of elastic members (80) are provided in the foregoing configuration, pressure applied to the refrigerant pipe (15) from the elastic members (80) can be easily equalized.

A tenth aspect of the invention is intended for the refrigerant pipe attachment structure of any one of the first to seventh aspects of the invention, in which a reinforcement bead (80b) is formed in a vicinity of part of the elastic member (80) pressed against the pressing mechanism (90).

In the foregoing configuration, the stiffness of the elastic member (80) can be increased.

An eleventh aspect of the invention is intended for the refrigerant pipe attachment structure of the fifth aspect of the invention, in which the pressing mechanism (90) is a screw (91), and a screw hole (75) having a composite shape of a large diameter part (75a) through which a head of the screw (91) passes and a small diameter part (75b) having such a size that the screw (91) can be tightened is formed in the elastic member (80).

In the foregoing configuration, the elastic member (80) can be temporarily fixed.

ADVANTAGES OF THE INVENTION

According to the present disclosure, since the elastic member (80) extends in the extension direction of the refrigerant pipe (15), the contact area between the elastic member (80) and the refrigerant pipe (15) can be expanded. Thus, it can be ensured that the refrigerant pipe (15) is pressed against the heat transfer member (70), and the thermal resistance between the refrigerant pipe (15) and the heat transfer member (70) can be reduced. Moreover, since the groove (72) of the heat transfer member (70) extends in the extension direction of the refrigerant pipe (15), a sufficient heat transfer area between the heat transfer member (70) and the refrigerant pipe (15) can be ensured. Thus, sufficient performance for cooling the cooling target (63) can be ensured. Further, according to the present disclosure, it can be ensured that the refrigerant pipe (15) is held between the elastic member (80) and the heat transfer member (70).

Particularly in the second aspect of the invention, since the bent part (86) is formed in the elastic member (80), sufficient stiffness of the elastic member (80) in the longitudinal direction thereof can be ensured. Thus, pressing force acting on the elastic member (80) is likely to be relatively uniform in the extension direction of the refrigerant pipe (15). As a result, sufficient attachment strength of the refrigerant pipe (15) can be ensured, and the thermal resistance between the refrigerant pipe (15) and the heat transfer member (70) can be reduced. Moreover, the bent part (86) can ensure a certain level of spring properties in the width direction of the elastic member (80). Thus, the elastic member (80) can be sufficiently deformed toward the heat transfer member (70), and desired pressing force can be obtained.

In the third aspect of the invention, since the pipe-facing part (82) of the elastic member (80) is formed in the flat plate shape, the pipe-facing part (82) and the refrigerant pipe (15) can be in line contact with each other in the extension direction of the refrigerant pipe (15). Thus, even if the pipe-facing part (82) pressed by the pressing mechanism (90) is slightly inclined about the axis of the refrigerant pipe (15), the line contact between the pipe-facing part (82) and the refrigerant pipe (15) is maintained. As a result, it can be ensured that the refrigerant pipe (15) is pressed by the elastic member (80). Consequently, the attachment strength of the refrigerant pipe (15) can be further improved, and sufficient heat transfer between the refrigerant pipe (15) and the heat transfer member (70) can be ensured.

In the fourth aspect of the invention, the plurality of grooves (72) are formed in the heat transfer member (70), and the elastic member (80) is formed over the grooves (72). Thus, the number of components such as the heat transfer member (70) and the elastic member (80) can be reduced, and the refrigerant pipes (15) can be held between the heat transfer member (70) and the elastic member (80).

Particularly in the fifth aspect of the invention, the two refrigerant pipes (15) can be held between the heat transfer member (70) and the elastic member (80). Moreover, the pressing target (84) is formed between the two grooves (72). Thus, the single pressing mechanism (90) equalizes pressing force of the pipe-facing parts (82) against the refrigerant pipes (15). As a result, the attachment strength of each refrigerant pipe (15) can be ensured, and the thermal resistance between each refrigerant pipe (15) and the heat transfer member (70) can be reduced.

In the sixth aspect of the invention, the heat transfer enhancing material (78) can further reduce the thermal resistance between the refrigerant pipe (15) and the heat transfer member (70).

In the seventh aspect of the invention, the following structure is employed: the engagement part (96, 123) of the pressing mechanism (90) is detachably engaged with the engagement groove of the heat transfer member (70), and the gripping part (94, 125) of the pressing mechanism (90) is operated to switch between pressing of the elastic member (80) and releasing of the elastic member (80). Thus, attachment of the pressing mechanism (90) and pressing of the elastic member (80) can be relatively easily performed. Consequently, installation of the attachment structure for the refrigerant pipe (15) can be facilitated, and the degree of freedom of layout of the refrigerant pipe (15) and the cooling target (63) is improved.

According to each of the eighth and ninth aspects of the invention, since pressure applied to the refrigerant pipe (15) from the elastic member (80) can be easily equalized, the heat transfer between the refrigerant pipe (15) and the heat transfer member (70) can be further ensured.

According to the tenth aspect of the invention, sufficient force for pressing the pipe can be obtained.

According to the eleventh aspect of the invention, tightening of the screw (91) can be facilitated.

DESCRIPTION OF EMBODIMENTS

Figure 1:
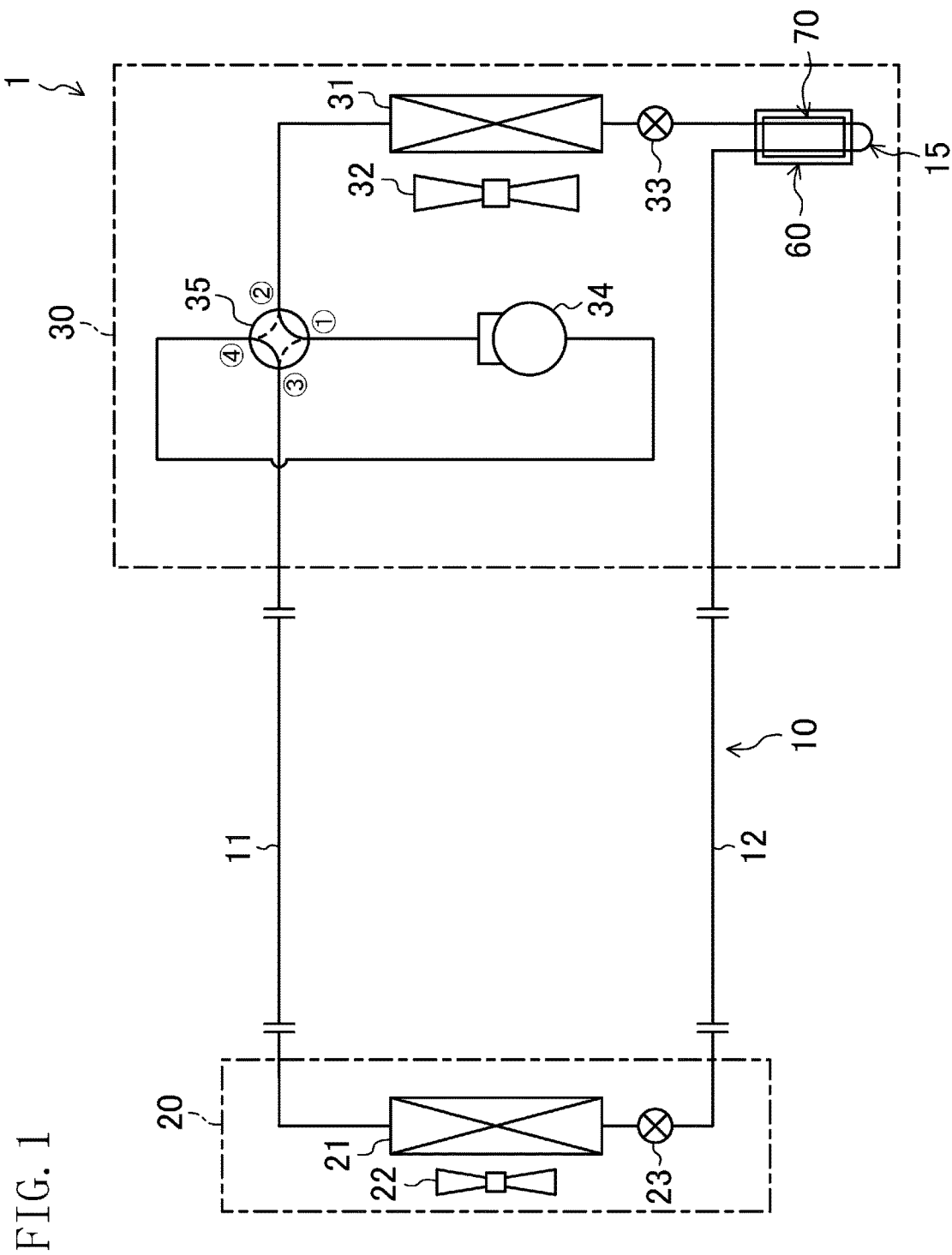
FIG. 1 is a schematic piping diagram of an air conditioner of a first embodiment.

Embodiments of the present disclosure will be described below in detail with reference to drawings. Note that the embodiments described below will be set forth merely for the purpose of preferred examples in nature, and are not intended to limit the scope, applications, and use of the invention.

<<First Embodiment of the Invention>>

An embodiment of the present disclosure relates to an air conditioner (1) including a refrigerant circuit (10) and configured to switch between an air cooling operation and an air heating operation. The air conditioner (1) includes an indoor unit (20) installed inside a room, and an outdoor unit (30) installed outside the room. The indoor unit (20) and the outdoor unit (30) are connected together through two communication pipes (11, 12) to form the refrigerant circuit (10) which is a closed circuit. The refrigerant circuit (10) is filled with refrigerant. Refrigerant circulates through the refrigerant circuit (10) to perform a vapor compression refrigeration cycle.

<Indoor Unit>

The indoor unit (20) includes an indoor heat exchanger (21), an indoor fan (22), and an indoor expansion valve (23). The indoor heat exchanger (21) is, e.g., a cross-fin type fin-and-tube heat exchanger. In the indoor heat exchanger (21), heat is exchanged between refrigerant flowing through a heat transfer pipe of the indoor heat exchanger (21) and air sent by the indoor fan (22). The indoor expansion valve (23) is, e.g., an electronic expansion valve.

<Outdoor Unit>

The outdoor unit (30) includes an outdoor heat exchanger (31), an outdoor fan (32), an outdoor expansion valve (33), a compressor (34), and a four-way valve (35). The outdoor heat exchanger (31) is, e.g., a cross-fin type fin-and-tube heat exchanger. In the outdoor heat exchanger (31), heat is exchanged between refrigerant flowing through a heat transfer pipe of the outdoor heat exchanger (31) and air sent by the outdoor fan (32). The outdoor expansion valve (33) is, e.g., an electronic expansion valve. The compressor (34) is, e.g., a rotary compressor such as a scroll compressor. The four-way valve (35) is formed with first to fourth ports, and is configured to switch a refrigerant circulation direction in the refrigerant circuit (10). In the air cooling operation, the four-way valve (35) is in the state (indicated by a solid line in FIG. 1) in which the first and second ports communicate with each other and the third and fourth ports communicate with each other. In the air heating operation, the four-way valve (35) is in the state (indicated by a dashed line in FIG.

1) in which the first and third ports communicate with each other and the second and fourth ports communicate with each other.

Figure 2:
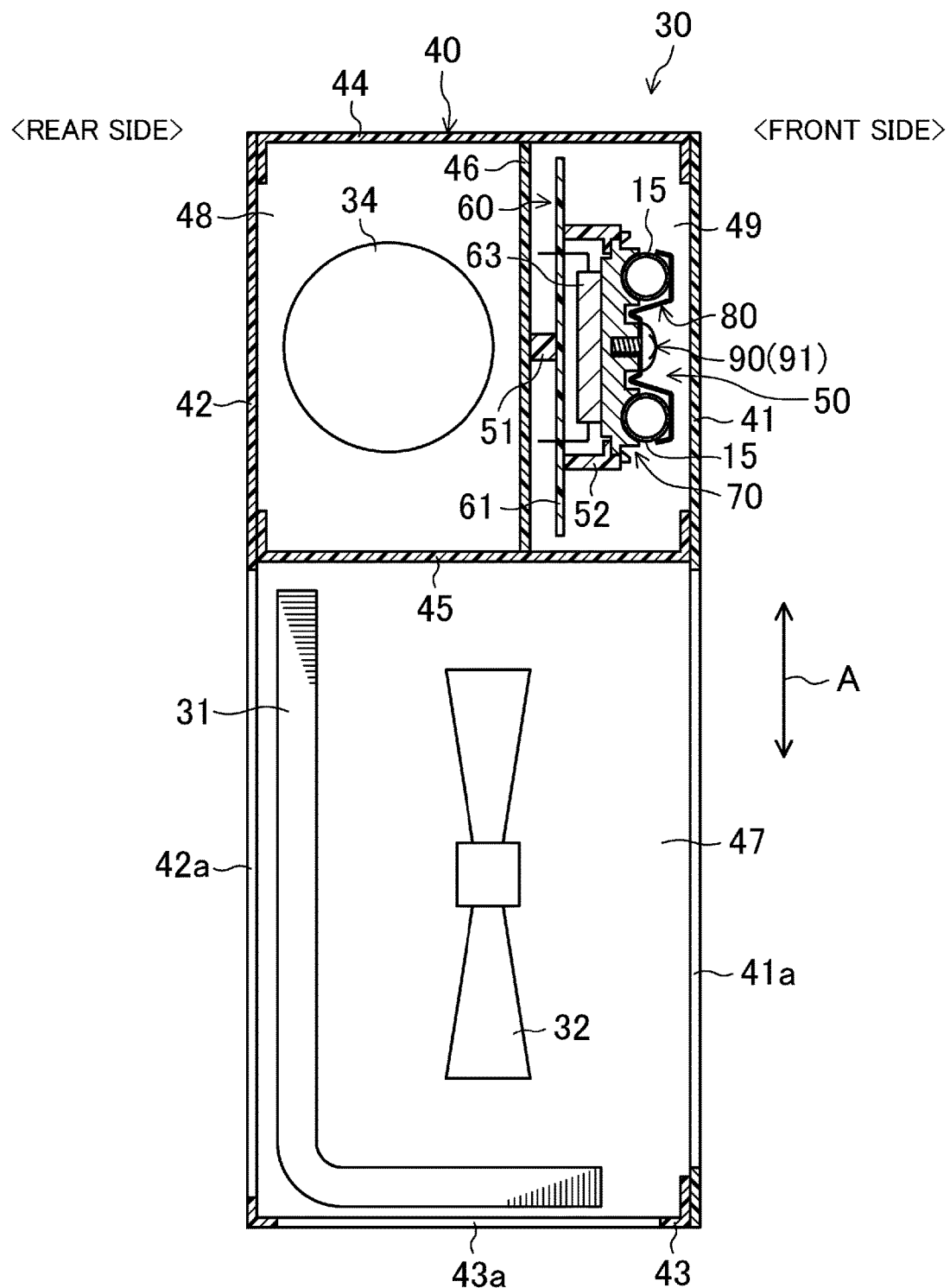
FIG. 2 is a schematic cross-sectional view of an outdoor unit of the first embodiment.

Referring to FIG. 2, the outdoor unit (30) includes a box-shaped casing (40). The casing (40) includes a front panel (41), a rear panel (42), a first side panel (43), and a second side panel (44). The front panel (41) is provided on a front side of the outdoor unit (30). An inlet port (41a) through which outdoor air is taken is formed in the front panel (41). The front panel (41) is detachably attached to a body of the casing (40). The rear panel (42) is provided on a rear side of the outdoor unit (30). An outlet port (42a) through which outdoor air is discharged is formed in the rear panel (42). The first side panel (43) is provided on one side of the outdoor unit (30) in a width direction (i.e., a direction indicated by an arrow A in FIG. 2) thereof. An outlet port (43a) is formed in the first side panel (43). The second side panel (44) is provided on the other side of the outdoor unit (30) in the width direction thereof.

The casing (40) further includes a lengthwise partition plate (45) and a widthwise partition plate (46). The lengthwise partition plate (45) divides an internal space of the casing (40) into two spaces arranged in the width direction. One of the spaces close to the first side panel (43) serves as a heat exchanger chamber (47). The other space close to the second side panel (44) is further divided into front and rear spaces by the widthwise partition plate (46). Of such spaces, the rear space serves as a compressor chamber (48), and the front space serves as an electric component chamber (49).

<Components in Electric Component Chamber>

Components in the electric component chamber (49) will be described in detail with reference to FIGS. 1-4. A power conversion device (60), a refrigerant jacket (70), and a cooling pipe (15) are housed in the electric component chamber (49). The power conversion device (60) is configured to supply power to a motor of the compressor (34) and to control the rotational speed of the motor. The power conversion device (60) includes a printed circuit board (61) and a power element (63) attached to the printed circuit board (61) through lead wires (62). The printed circuit board (61) is fixed to the widthwise partition plate (46) through, e.g., a support member (51). Note that the printed circuit board (61) may be fixed to another part inside the casing (40).

The power element (63) of the present embodiment is disposed in the front of the printed circuit board (61). The power element (63) is, e.g., a switching element of an inverter circuit. The power element (63) is a heat generation component generating heat in operation of the compressor (34), and is provided as a cooling target of the refrigerant jacket (70). The power element (63) is cooled by the refrigerant jacket (70) such that the temperature of the power element (63) does not exceed an operable temperature (e.g., 90° C.).

The refrigerant jacket (70) is made of a metal material having high thermal conductivity, such as aluminum. The refrigerant jacket (70) is disposed so as to contact a surface (front surface) of the power element (63), and is in thermal contact with the power element (63). The refrigerant jacket (70) is formed in a substantially flat plate shape. The refrigerant jacket (70) is fixed to the printed circuit board (61) through a frame-shaped fixing member (52). The fixing member (52) includes a frame body (52a) engaged with an outer circumferential part (70a) of the refrigerant jacket (70), and a plurality of tabs (52b) configured to hold, from the outside, the refrigerant jacket (70) engaged with the frame body (52a). Thus, the refrigerant jacket (70) is detachably attached to the fixing member (52).

The cooling pipe (15) forms part of a refrigerant pipe of the refrigerant circuit (10). The cooling pipe (15) of the present embodiment is connected to a high-pressure liquid line in the refrigerant circuit (10). That is, high-pressure liquid refrigerant condensed in the heat exchanger (21, 31) flows through the cooling pipe (15). The cooling pipe (15) includes two straight pipe parts (16) and a U-shaped pipe part (17) connecting end parts of the straight pipe parts (16) together. The straight pipe parts (16) are arranged adjacent to each other such that extension directions thereof are substantially parallel to each other.

<Refrigerant Pipe Attachment Structure>

Figure 3:
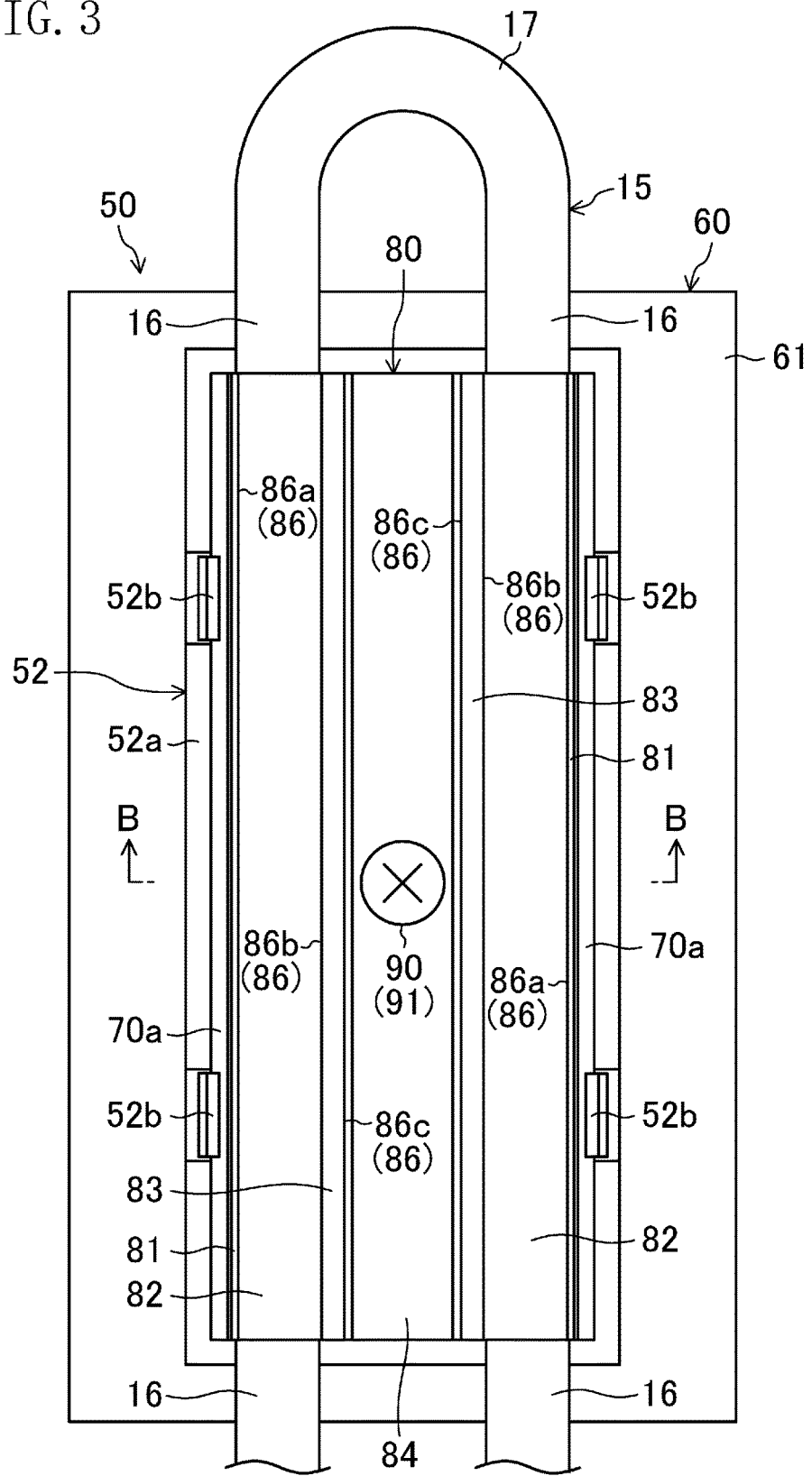
FIG. 3 is a front view of an attachment structure of the first embodiment.
Figure 4:
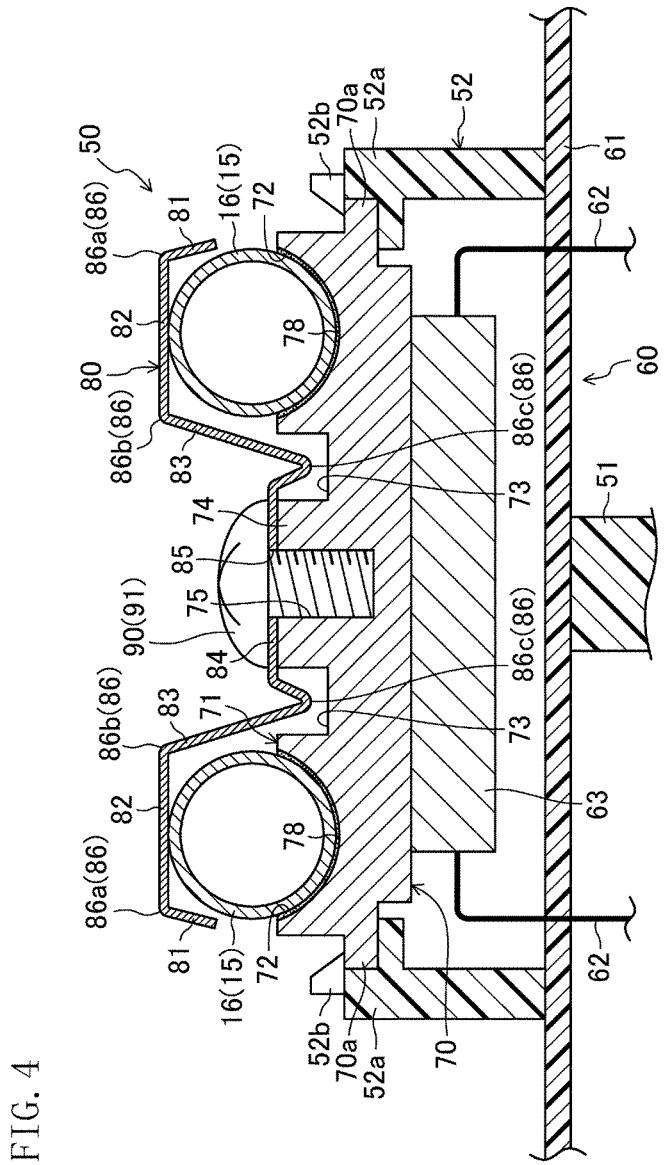
FIG. 4 is a cross-sectional view along a B-B line illustrated in FIG. 3.

An attachment structure (50) configured to attach the cooling pipe (15) to the refrigerant jacket (70) will be described in detail with reference to FIGS. 3 and 4. The attachment structure (50) of the present embodiment includes the single refrigerant jacket (70), a single leaf spring member (80), and a single screw (91).

The refrigerant jacket (70) extends along the extension direction of the straight pipe part (16) of the cooling pipe (15). A pair of pipe grooves (72), a pair of recesses (73), and a single middle part (74) are formed at a surface (71) of the refrigerant jacket (70) opposite to the printed circuit board (61).

Each pipe groove (72) extends in a longitudinal direction of the refrigerant jacket (70) along the straight pipe part (16) of the cooling pipe (15). The pipe groove (72) is formed so as to have a substantially arc-shaped cross section perpendicular to the axis of the cooling pipe (15). The pipe groove (72) serves as a groove into which part of an outer circumferential part of the cooling pipe (15) is fitted. Thermal conductive grease (78) is interposed between the cooling pipe (15) and each pipe groove (72). The thermal conductive grease (78) serves as a heat transfer enhancing material filling a minute clearance between the cooling pipe (15) and each pipe groove (72) to reduce thermal resistance and to enhance heat transfer between the cooling pipe (15) and each pipe groove (72).

The recesses (73) are arranged between the pipe grooves (72). The recesses (73) linearly extend from one end to the other end of the refrigerant jacket (70) in the longitudinal direction thereof. In each recess (73), a corresponding one of V-shaped bent parts (86c) (described in detail later) of the leaf spring member (80) is disposed.

The middle part (74) is formed between the recesses (73). A screw hole (75) is formed in the middle part (74). The screw hole (75) is formed at the center of the refrigerant jacket (70). That is, the screw hole (75) is positioned in the middle of the refrigerant jacket (70) in the longitudinal direction thereof and in the middle of the refrigerant jacket (70) in a width direction thereof.

The leaf spring member (80) is formed in such a manner that a spring steel plate is bent. The leaf spring member (80) is formed in an elongated plate shape extending along the extension direction of the cooling pipe (15), and is disposed so as to face the refrigerant jacket (70). The leaf spring member (80) extends over the pipe grooves (72) of the refrigerant jacket (70). The leaf spring member (80) includes a pair of outer plate parts (81), a pair of pipe-facing parts (82), a pair of inner plate parts (83), and a single attachment plate part (84). The leaf spring member (80) serves as an elastic member configured to bias the cooling pipe (15) toward the refrigerant jacket (70).

Each outer plate part (81) is formed at a corresponding one of side end parts of the leaf spring member (80) in a width direction thereof. The outer plate part (81) is formed in a flat plate shape bent from the pipe-facing part (82) toward the straight pipe part (16) of the cooling pipe (15).

The pipe-facing part (82) extends in the extension direction of the straight pipe part (16) of the cooling pipe (15) so as to face the straight pipe part (16). That is, the pipe-facing part (82) is formed at a position facing the pipe groove (72) of the refrigerant jacket (70). The pipe-facing part (82) is formed in a flat plate shape so as to be substantially in line contact with an outer circumferential surface of the straight pipe part (16).

The inner plate part (83) is formed closer to the middle of the leaf spring member (80) in the width direction thereof relative to the pipe-facing part (82). The inner plate part (83) is formed in a flat plate shape bent from the pipe-facing part (82) toward the straight pipe part (16) of the cooling pipe (15). The leaf spring member (80) is provided such that the outer plate part (81), the pipe-facing part (82), and the inner plate part (83) surround the straight pipe part (16).

The attachment plate part (84) is formed in the middle of the leaf spring member (80) in the width direction thereof so as to be interposed between the inner plate parts (83). The attachment plate part (84) is formed in a flat plate shape extending in the extension direction of the straight pipe part (16), and is formed along the middle part (74) of the refrigerant jacket (70). At the center of the attachment plate part (84), a through-hole (85) is formed corresponding to the screw hole (75) of the refrigerant jacket (70).

In the leaf spring member (80), bent parts (86) are formed at six points. Each bent part (86) is formed straight along a longitudinal direction of the leaf spring member (80). The six bent parts (86) include a pair of outer bent parts (86a), a pair of inner bent parts (86b), and the pair of V-shaped bent parts (86c). The outer bent part (86a) is formed between the outer plate part (81) and the pipe-facing part (82), and the inner bent part (86b) is formed between the pipe-facing part (82) and the inner plate part (83). The V-shaped bent part (86c) is formed between the inner plate part (83) and the attachment plate part (84). The V-shaped bent part (86c) protrudes in a substantially V-shape toward the inside of the recess (73) of the refrigerant jacket (70). The bent parts (86) function as reinforcement ribs configured to increase the stiffness of the leaf spring member (80) in the longitudinal direction thereof. Thus, the leaf spring member (80) has stiffness greater in the longitudinal direction than in the width direction. Note that the bent part (86) may be formed in, e.g., a substantially U-shape.

In the present embodiment, the screw (91) serves as a pressing mechanism (90) configured to press the leaf spring member (80) toward the refrigerant jacket (70). The attachment plate part (84) serves as a pressing target which is being pressed against the refrigerant jacket (70) with tightening the screw (91).

Operation

Operation of the air conditioner (1) will be described with reference to FIG. 1. The air conditioner (1) switches between the air cooling operation and the air heating operation.

<Air Cooling Operation>

In the air cooling operation, refrigerant compressed in the compressor (34) is condensed in the outdoor heat exchanger (31). The condensed refrigerant passes through, e.g., the outdoor expansion valve (33) in a fully-open state, and then flows into the cooling pipe (15).

In operation of the compressor (34), the power element (63) generates heat. The heat of the power element (63) is transmitted to the refrigerant jacket (70), the thermal conductive grease (78), and the cooling pipe (15) in this order, and then is applied to refrigerant inside the cooling pipe (15). As a result, the power element (63) is cooled, and is maintained at a predetermined temperature at which the power element (63) is operable.

The pressure of the refrigerant flowing out from the cooling pipe (15) is reduced in the indoor expansion valve (23), and then such refrigerant is evaporated in the indoor heat exchanger (21). As a result, indoor air is cooled. The evaporated refrigerant flows into the compressor (34), and then is compressed.

<Air Heating Operation>

In the air heating operation, refrigerant compressed in the compressor (34) is condensed in the indoor heat exchanger (21). As a result, indoor air is heated. The condensed refrigerant passes through, e.g., the indoor expansion valve (23) in a fully-closed state, and then flows into the cooling pipe (15). As in the air cooling operation, the refrigerant is used for cooling the power element (63). The pressure of the refrigerant flowing out from the cooling pipe (15) is reduced in the outdoor expansion valve (33), and then such refrigerant is evaporated in the outdoor heat exchanger (31). The evaporated refrigerant flows into the compressor (34), and then is compressed.

Refrigerant Pipe Attachment Structure

In the attachment structure (50), the cooling pipe (15) is fitted into each pipe groove (72) of the refrigerant jacket (70). In such a state, the leaf spring member (80) is disposed so as to face the refrigerant jacket (70). The position of the screw hole (75) of the refrigerant jacket (70) and the position of the through-hole (85) of the leaf spring member (80) are adjusted to each other, and then the screw (91) is tightened into the screw hole (75). Such screw tightening is performed in the state in which the front panel (41) is detached from the body of the casing (40). After the refrigerant jacket (70) and the leaf spring member (80) are temporarily tightened together with the screw (91) outside the casing (40), the screw (91) is completely tightened with the cooling pipe (15) being interposed between the refrigerant jacket (70) and the leaf spring member (80). As in the foregoing, tightening of the screw (91) can be facilitated.

When the screw (91) is tightened, the attachment plate part (84) of the leaf spring member (80) is pressed against the refrigerant jacket (70). Accordingly, the pipe-facing parts (82) connected to the attachment plate part (84) are elastically deformed toward the refrigerant jacket (70). In such a state, the V-shaped bent parts (86c) improve spring properties of the leaf spring member (80), and therefore it can be ensured that the pipe-facing parts (82) are displaced toward the refrigerant jacket (70). Meanwhile, the bent parts (86) improve the stiffness of the leaf spring member (80) in the longitudinal direction thereof, and therefore pressing force relatively equally acts on the straight pipe parts (16) in the extension direction thereof. Moreover, since the screw (91) is tightened into the middle of the attachment plate part (84) in the longitudinal direction thereof, pressing force of the leaf spring member (80) in the longitudinal direction thereof is easily equalized.

Since the attachment plate part (84) between the pipe-facing parts (82) is pressed with the screw (91), pressing force of the pipe-facing parts (82) against the cooling pipe (15) can be easily equalized. Moreover, since the two cooling pipes (15) can be pressed against the refrigerant jacket (70) with the single screw (91), the number of components can be reduced, and the number of assembly steps can be also reduced.

As described above, each of the two cooling pipes (15) is biased toward a corresponding one of the pipe grooves (72)

of the refrigerant jacket (70). Thus, the cooling pipe (15) is sandwiched between each pipe groove (72) of the refrigerant jacket (70) and each pipe-facing part (82) of the leaf spring member (80). The leaf spring member (80) is, as described above, pressed against the cooling pipe (15) to reduce a clearance between the cooling pipe (15) and the refrigerant jacket (70) and to reduce thermal resistance between the cooling pipe (15) and the refrigerant jacket (70). Moreover, since the thermal conductive grease (78) is interposed between the cooling pipe (15) and each pipe groove (72), the minute clearance between the cooling pipe (15) and each pipe groove (72) can be filled with the thermal conductive grease (78). Thus, thermal resistance between the cooling pipe (15) and each pipe groove (72) can be further reduced.

The leaf spring member (80) has a certain degree of flexibility. Thus, even if the processing accuracy of the leaf spring member (80) is slightly lowered, the cooling pipe (15) can be firmly pressed by the leaf spring member (80). Moreover, each pipe-facing part (82) is in a flat plate shape. Thus, even if the pipe-facing part (82) is slightly inclined about the axis of the cooling pipe (15), the line contact between the pipe-facing part (82) and the cooling pipe (15) can be maintained. Consequently, it can be ensured that the cooling pipe (15) is pressed against the refrigerant jacket (70).

The pipe-facing parts (82) and the pipe grooves (72) extend in the extension direction of the straight pipe part (16) of the cooling pipe (15). Thus, a contact area between the pipe-facing part (82) and the straight pipe part (16) can be expanded, and sufficient pressing force on the straight pipe part (16) can be ensured. Moreover, it can be ensured that the cooling pipe (15) is held between each pipe-facing part (82) and each pipe groove (72). Further, a sufficient heat transfer area between the cooling pipe (15) and each pipe groove (72) can be ensured. Thus, in the present embodiment, a sufficient effect for cooling the power element (63) can be produced, and heat generation of the power element (63) can be reduced.

Advantages of First Embodiment

According to the first embodiment, the attachment strength of the cooling pipe (15) can be increased between the cooling pipe (15) and each pipe groove (72), and heat transfer from the power element (63) to the cooling pipe (15) can be enhanced. Thus, it can be ensured that the power element (63) is efficiently cooled. As a result, the sufficient reliability of the power conversion device (60) and the air conditioner (1) can be ensured.

<<Second Embodiment of the Invention>>

An air conditioner (1) of a second embodiment of the present disclosure is different from that of the foregoing embodiment in a configuration of an attachment structure (50) for a cooling pipe (15). Differences from the first embodiment will be described below with reference to FIGS. 5-9.

Figure 5:
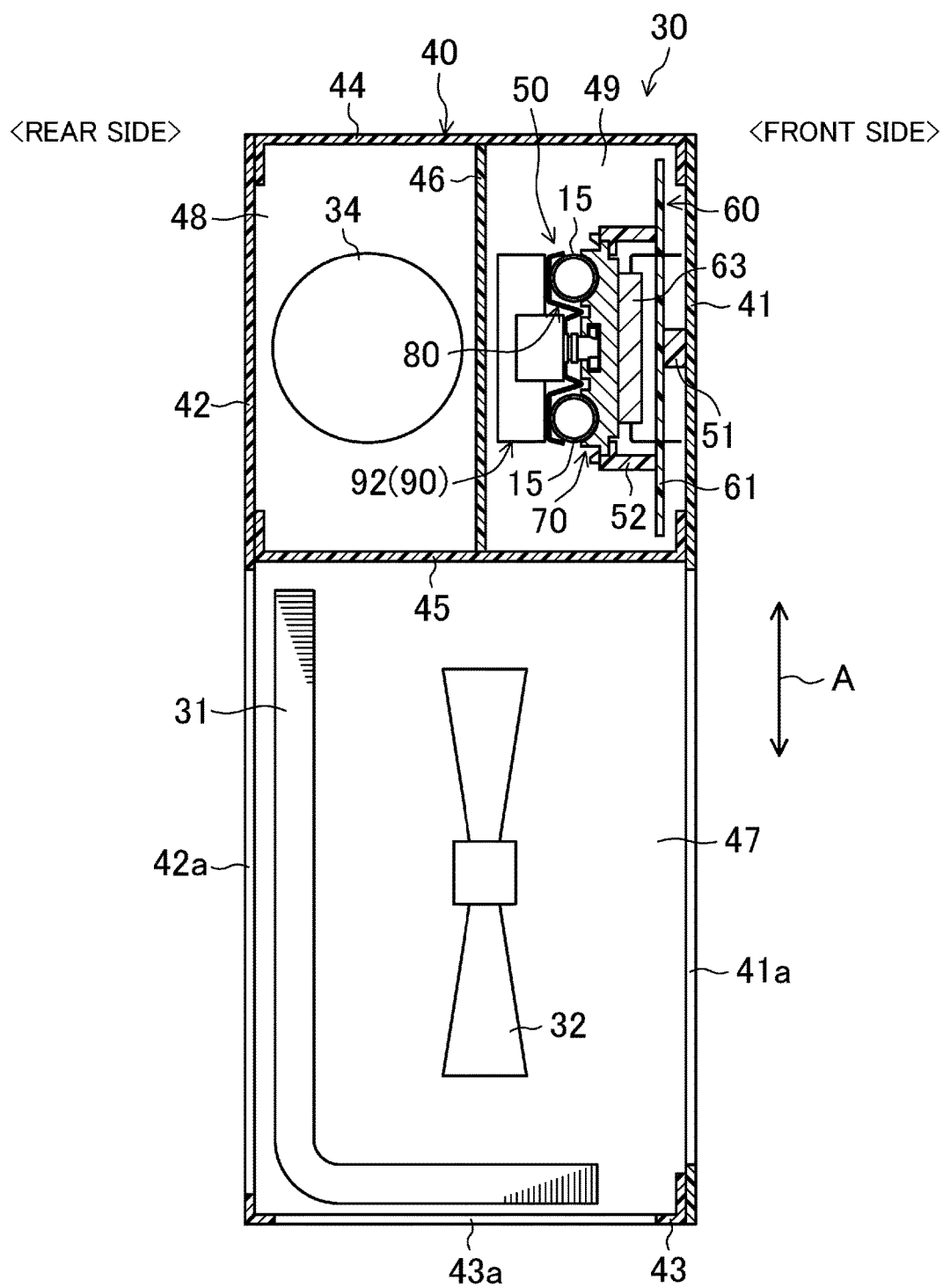
FIG. 5 is a schematic cross-sectional view of an outdoor unit of a second embodiment.

In the air conditioner (1) of the second embodiment, a power conversion device (60) is, referring to FIG. 5, disposed so as to face a front panel (41), and the cooling pipe (15) is disposed at the rear of the power conversion device (60).

In the power conversion device (60), a printed circuit board (61) is disposed at the rear of the front panel (41), and a power element (63) is disposed at the rear of the printed circuit board (61). The printed circuit board (61) is fixed to a casing (40) through a support member (51). The support member (51) is fixed to, e.g., a top panel of the casing (40) or other member so that the front panel (41) is detachable/attachable.

A refrigerant jacket (70) is fixed to a surface (rear surface) of the power element (63). As in the first embodiment, pipe grooves (72) are formed at a surface (rear surface) of the refrigerant jacket (70). A leaf spring member (80) biases the cooling pipe (15) toward the refrigerant jacket (70).

Figure 7:
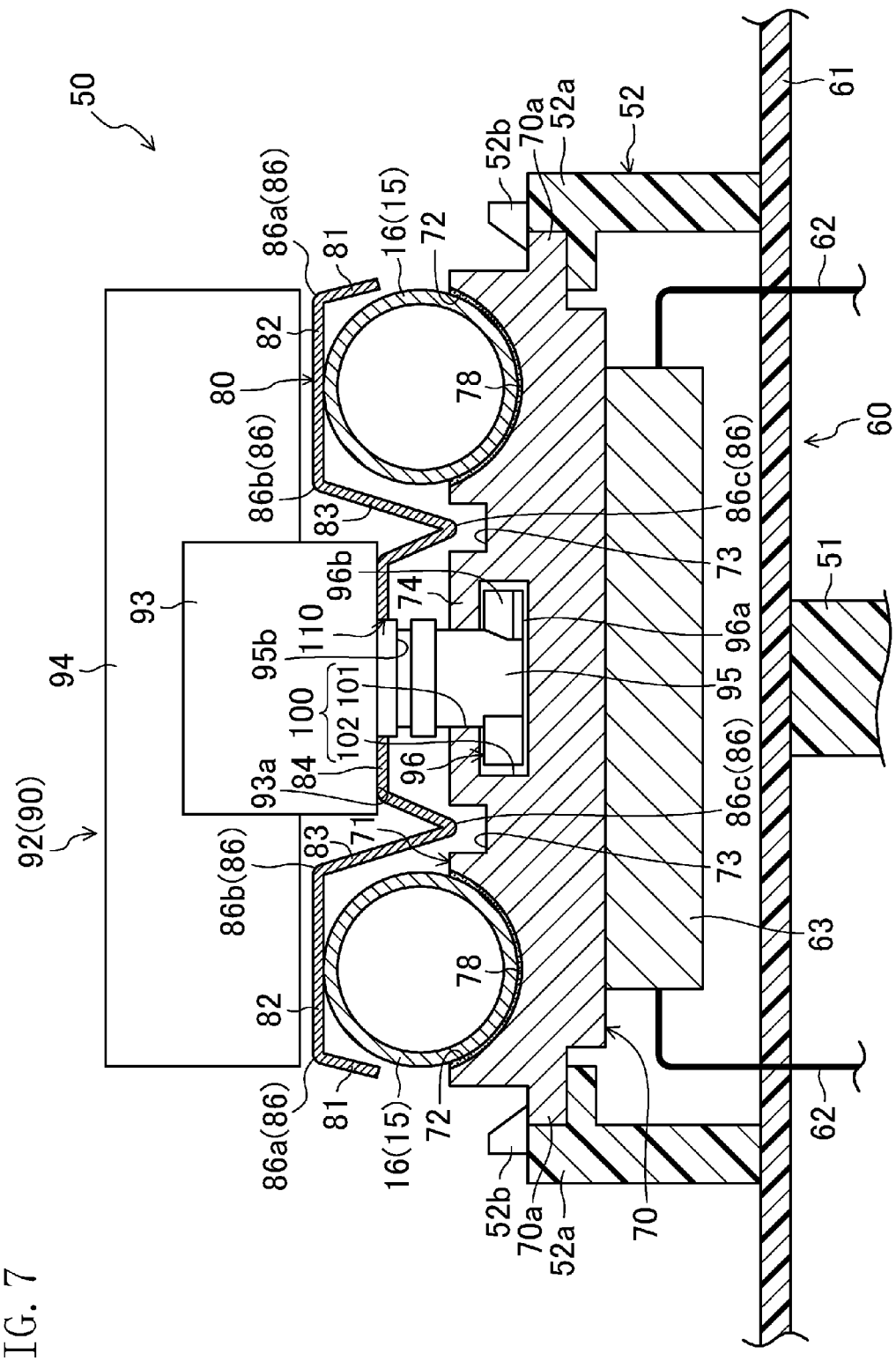
FIG. 7 is a cross-sectional view along a D-D line illustrated in FIG. 6.

Referring to FIG. 7, an engagement groove (100) is formed in the refrigerant jacket (70) of the second embodiment. The engagement groove (100) is formed in a middle part (74) of the refrigerant jacket (70) so as to extend between both ends of the refrigerant jacket (70) in a longitudinal direction thereof. That is, the engagement groove (100) can be easily formed by extrusion of the refrigerant jacket (70) in the longitudinal direction thereof.

The engagement groove (100) includes an outer groove part (101) formed at a surface of the middle part (74), and an inner groove part (102) formed inside the middle part (74) so as to communicate with the outer groove part (101). The outer groove part (101) and the inner groove part (102) are formed in the middle of the middle part (74) in a width direction thereof. The center position of the outer groove part (101) in the width direction of the middle part (74) and the center position of the inner groove part (102) in the width direction of the middle part (74) are coincident with each other. The width of the inner groove part (102) is greater than that of the outer groove part (101).

Figure 8:
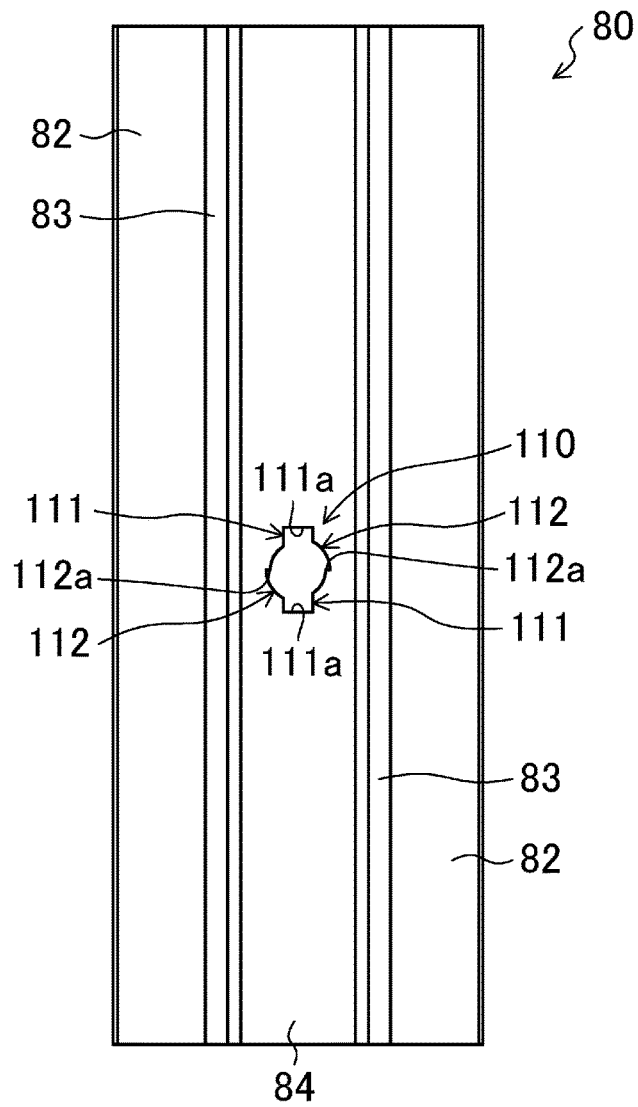
FIG. 8 is a back view of a leaf spring member of the second embodiment.

In the leaf spring member (80) of the second embodiment, an insertion hole (110) is, referring to FIG. 8, formed in the middle of an attachment plate part (84) in a longitudinal direction thereof and in the middle of the attachment plate part (84) in a width direction thereof. In an inner circumferential part of the insertion hole (110), a pair of rectangular parts (111) and a pair of arc-shaped parts (112) are alternately arranged one by one in a circumferential direction of the insertion hole (110). The rectangular parts (111) are arranged in a longitudinal direction of the engagement groove (100) so as to face each other. A distance between opposing sides (111a) of the rectangular parts (111) is substantially equal to the width of the inner groove part (102). The arc-shaped parts (112) are arranged perpendicular to the longitudinal direction of the engagement groove (100) so as to face each other. A stepped part (112a) inwardly protruding in a radial direction of the arc-shaped part (112) is formed in the middle of each arc-shaped part (112) in a circumferential direction thereof.

Figure 6:
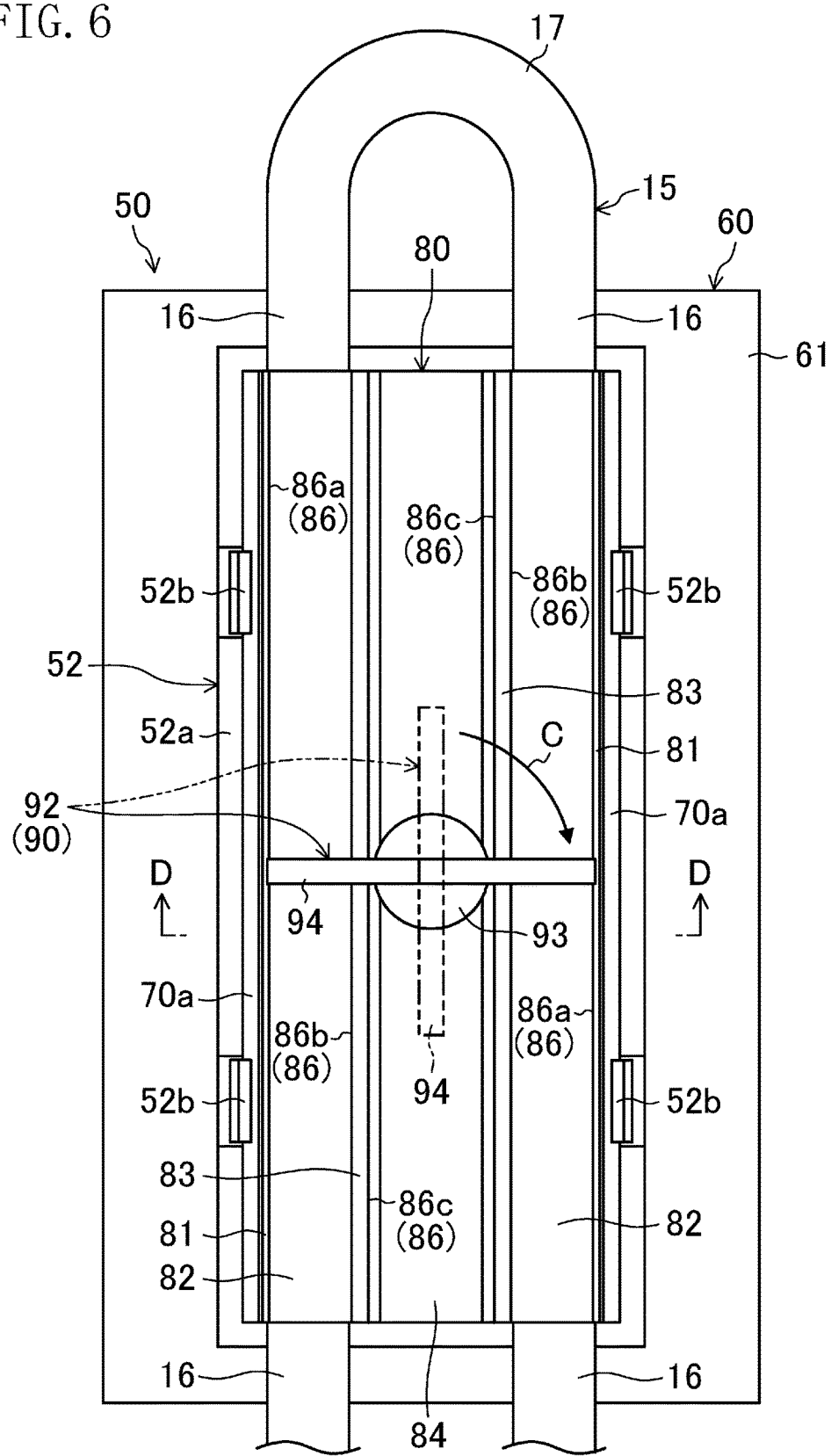
FIG. 6 is a back view of an attachment structure of the second embodiment.
Figure 9:
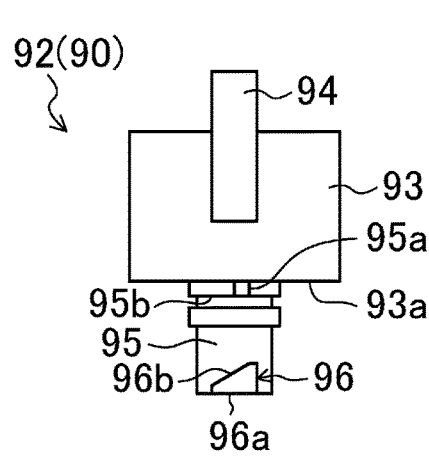
FIG. 9 is a side view of a pressing mechanism of the second embodiment.
Figure 10:
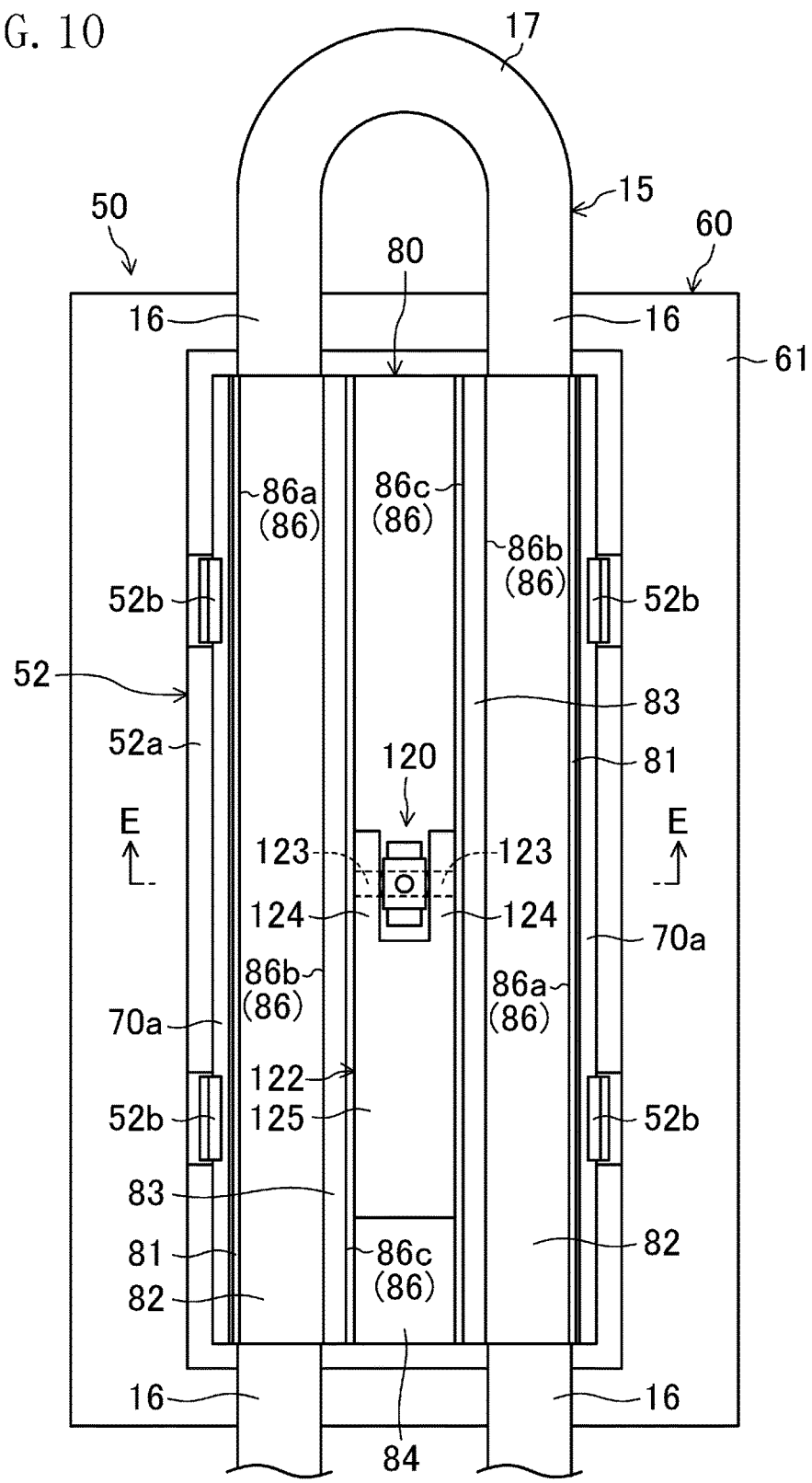
FIG. 10 is a back view of an attachment structure of a third embodiment.
Figure 11:
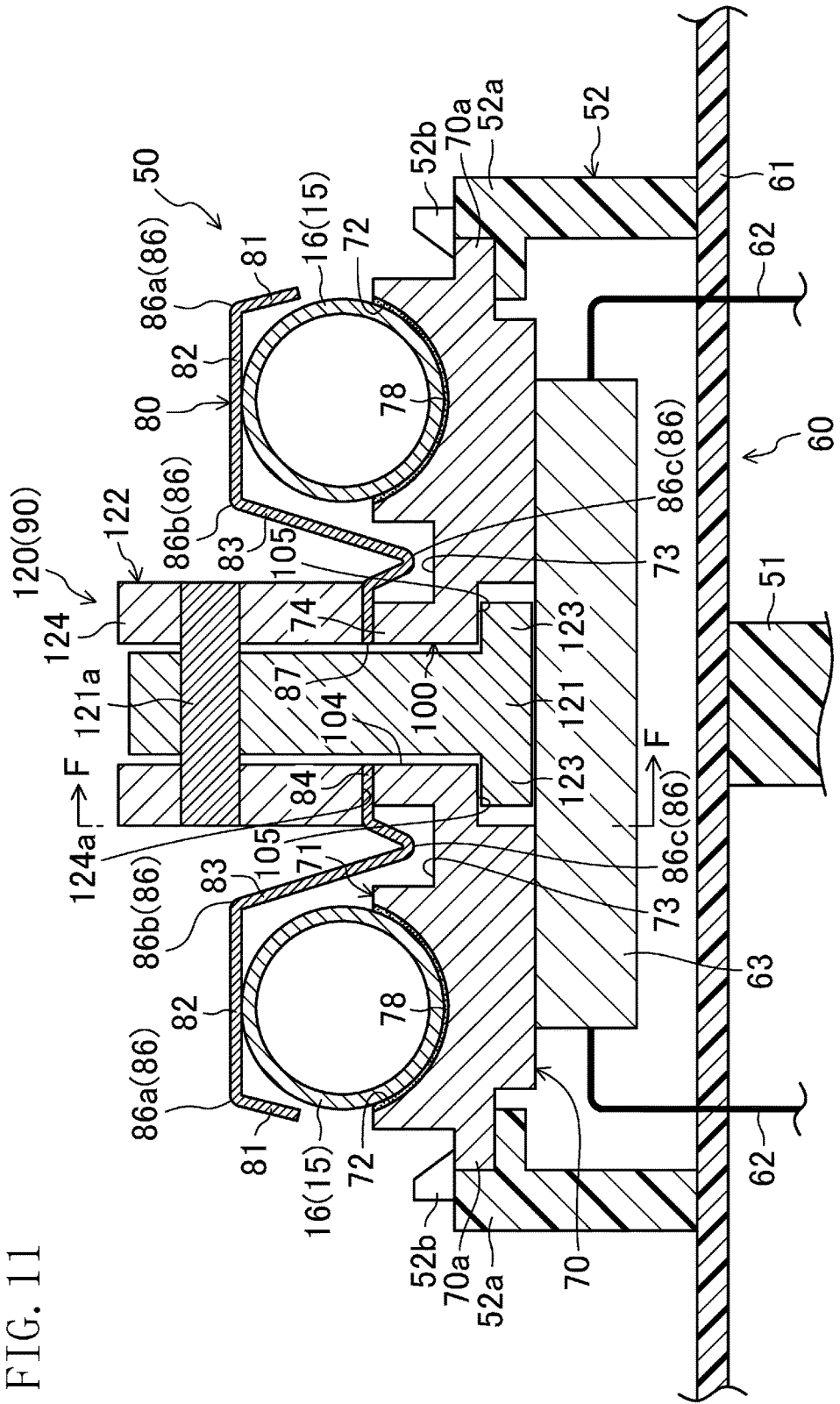
FIG. 11 is a cross-sectional view along an E-E line illustrated in FIG. 10.
Figure 12:
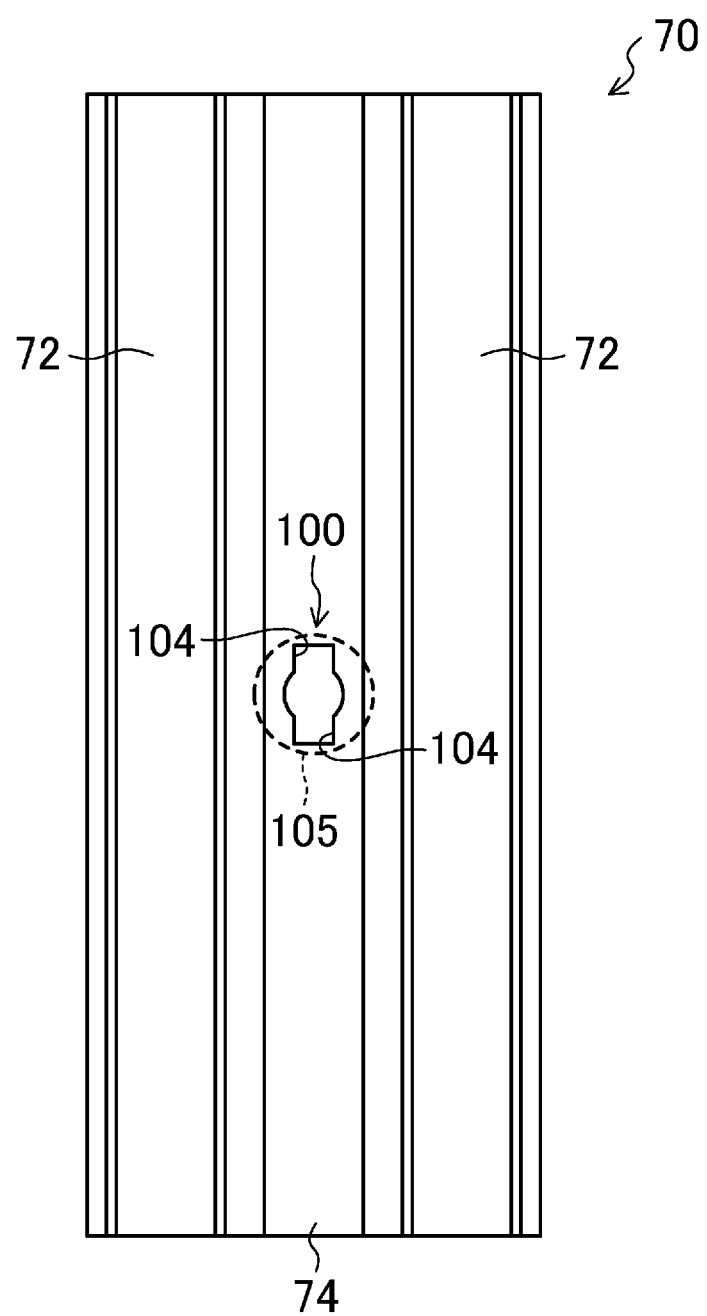
FIG. 12 is a back view of a refrigerant jacket of the third embodiment.

Referring to FIGS. 6, 7, and 9, a pressing mechanism (90) of the second embodiment is a rotary fastener (92). The rotary fastener (92) includes a cylindrical body (93), a gripping plate (94) formed at one end of the body (93) in an axial direction thereof, a rotary shaft (95) formed at the other end of the body (93) in the axial direction thereof, and a pair of protruding pins (96) formed at a tip end of the rotary shaft (95).

The gripping plate (94) is formed in an elongated plate shape outwardly extending in a radial direction of the body (93) so as to pass through the center of the body (93). The gripping plate (94) serves as a gripping part disposed outside the leaf spring member (80). The gripping plate (94) is rotatably displaced between a position indicated by a two-dot chain line in FIG. 6 and a position indicated by a solid line in FIG. 6.

The body (93) serves as a pressing part configured to press the attachment plate part (84) of the leaf spring member (80). Specifically, in the body (93), a pressing surface (93a) contacting the attachment plate part (84) is formed at an end surface of the body (93) opposite to the gripping plate (94) in the axial direction of the body (93). With rotation of the gripping plate (94), the body (93) is displaced between the position (see a first position illustrated in FIG. 6) at which the body (93) presses the leaf spring member (80) at the pressing surface (93a) and the position (i.e., a second position which is not shown in the figure) at which the leaf spring member (80) is released from the pressing surface (93a).

The rotary shaft (95) is formed in a substantially circular cylindrical shape so as to have a diameter smaller than that of the body (93). The rotary shaft (95) is integrally formed with the body (93) so as to be coaxial to the body (93). The rotary shaft (95) is inserted into the insertion hole (110) of the leaf spring member (80). Referring to FIG. 9, a stopper (95a) is formed in the vicinity of the body (93) on an outer circumferential surface of the rotary shaft (95). The stopper (95a) is a protrusion outwardly protruding from the surface of the rotary shaft (95) in a radial direction thereof. The stopper (95a) comes into contact with the stepped parts (112a) (see FIG. 8) of the leaf spring member (80) to restrict rotation of the rotary fastener (92). Thus, the rotary fastener (92) is prevented from rotating beyond a rotation angle range of about 90°.

A circular groove (95b) is formed in the vicinity of the body (93) at the outer circumferential surface of the rotary shaft (95). A ring-shaped member (not shown in the figure) such as a washer or a so-called E-ring is fixed to the circular groove (95b) in the state in which the rotary shaft (95) is inserted into the insertion hole (110) of the leaf spring member (80). Thus, the leaf spring member (80) can be integrally held with the rotary fastener (92).

The protruding pins (96) outwardly protrude from an outer circumferential edge part of the rotary shaft (95) in the radial direction thereof. The protruding pins (96) are arranged with equal pitch. A protrusion direction of the protruding pin (96) of the present embodiment is substantially coincident with a longitudinal direction of the gripping plate (94).

Each protruding pin (96) is formed so as to have a substantially trapezoidal cross section perpendicular to the protrusion direction of the protruding pin (96). More specifically, each protruding pin (96) includes a rectangular surface (96a) which is substantially flush with a tip end surface of the rotary shaft (95), and an inclined surface (96b) positioned closer to the body (93) and inclined relative to the rectangular surface (96a). The inclined surface (96b) is inclined so as to approach the tip end surface of the rotary shaft (95) in a rotation direction (direction indicated by an arrow C in FIG. 6) for attaching the rotary fastener (92) to the refrigerant jacket (70). The protruding pins (96) serve as engagement parts which can be engaged with the rectangular parts (111) of the insertion hole (110) of the leaf spring member (80) and the engagement groove (100) of the refrigerant jacket (70).

In the second embodiment, a user rotates the rotary fastener (92) with the user gripping the gripping plate (94), thereby easily holding the cooling pipe (15) between the leaf spring member (80) and the refrigerant jacket (70). Specifically, the cooling pipe (15) is interposed between the leaf spring member (80) and the refrigerant jacket (70) in the state in which the front panel (41) is detached from a body of the casing (40). In such a state, the user reaches his hand to the rear of the cooling pipe (15), and then inserts the protruding pins (96) of the rotary fastener (92) into the engagement groove (100) through the rectangular parts (111) of the insertion hole (110). That is, in the state in which the protruding pins (96) face the longitudinal direction of the engagement groove (100), the protruding pins (96) are inserted into the inner groove part (102) until the protruding pins (96) reach a bottom part of the inner groove part (102). The gripping plate (94) in the foregoing state (indicated by the two-dot chain line in FIG. 6) is rotated in the direction indicated by the arrow C. Thus, the inclined surfaces (96b) of the protruding pins (96) are guided along the arc-shaped parts (112), and the protruding pins (96) face a width direction of the inner groove part (102) (see FIG. 7). As a result, the protruding pins (96) are held inside the engagement groove (100), and the rotary fastener (92) is displaced toward the refrigerant jacket (70) such that the body (93) presses the leaf spring member (80). As described above, when the attachment plate part (84) is pressed toward the refrigerant jacket (70), a pair of pipe-facing parts (82) are elastically deformed toward the cooling pipe (15) as in the first embodiment. As a result, the cooling pipe (15) is held between the leaf spring member (80) and the refrigerant jacket (70).

In order to release the leaf spring member (80), the gripping plate (94) is rotated in a direction opposite to the direction indicated by the arrow C in FIG. 6. This brings about the state in which the protruding pins (96) are along the outer groove part (101). In such a state, the gripping plate (94) is pulled toward the rear (i.e., a side opposite to the refrigerant jacket (70)) to detach the protruding pins (96) from the engagement groove (100). Thus, the leaf spring member (80) is released.

In the second embodiment, the structure in which the leaf spring member (80) is pressed in such a manner that the gripping plate (94) is rotated with the protruding pins (96) being inserted into the engagement groove (100) is employed as described above. Thus, the leaf spring member (80) can be easily detached from the rear of the cooling pipe (15). As a result, in the second embodiment, the power conversion device (60) can be disposed in the front (i.e., close to the outside of the casing (40)) of the cooling pipe (15), and component replacement and maintenance of the power conversion device (60) are facilitated.

Moreover, in the second embodiment, the protruding pins (96) of the rotary fastener (92) can be freely positioned along the inner groove part (102). That is, in the second embodiment, the positions of the protruding pins (96) with respect to the refrigerant jacket (70) can be freely determined, and therefore installation is facilitated.

<<Third Embodiment of the Invention>>

An air conditioner (1) of a third embodiment of the present disclosure is different from the foregoing embodiments in a configuration of an attachment structure (50) for a cooling pipe (15). Differences from the second embodiment will be described below with reference to FIGS. 10-13.

An engagement groove (100) of a refrigerant jacket (70) of the third embodiment penetrates the refrigerant jacket (70) in a thickness direction thereof. The engagement groove (100) is formed at the center of a middle part (74). The engagement groove (100) includes a pair of key grooves (104) formed on a front side (i.e., a side close to a leaf spring member (80)) of the refrigerant jacket (70), and a circular cylindrical groove (105) formed at the rear of the key grooves (104).

A pressing mechanism (90) of the third embodiment is a lever fastener (120). The lever fastener (120) includes a circular cylindrical rod (121), a lever (122) pivotably supported at one end of the rod (121) in an axial direction thereof through a rotary shaft (121a), and a pair of keys (123) formed at the other end of the rod (121) in the axial direction thereof.

The lever (122) includes a discoid part (124) formed about the axis of the rotary shaft (121a), and a lever body (125) outwardly protruding from the discoid part (124) in a radial direction thereof. The lever body (125) serves as a gripping part which can be displaced outside the leaf spring member (80). In the discoid part (124), a protruding arc-shaped part (124a) outwardly protruding in the radial direction of the discoid part (124) so as to be perpendicular to an extension direction of the lever body (125) is formed. The protruding arc-shaped part (124a) serves as a pressing part which is, by displacement of the lever body (125), displaced between a first position (indicated by a solid line in FIG. 13) at which the leaf spring member (80) is pressed and a second position (indicated by a two-dot chain line in FIG. 13) at which the leaf spring member (80) is released.

The rod (121) is inserted into the engagement groove (100) through an insertion hole (87) of the leaf spring member (80). The keys (123) are integrally formed with an outer circumferential surface of a tip end part of the rod (121). Each key (123) is formed in a quadrangular prism shape so as to be engaged with a corresponding one of the key grooves (104). When the lever body (125) rotates about the center of the rod (121) in the state in which the keys (123) are inserted into the circular cylindrical groove (105) through the key grooves (104), the keys (123) are fitted into the circular cylindrical groove (105). That is, each key (123) serves as an engagement part detachably engaged with the engagement groove (100).

In the third embodiment, a user tilts the lever body (125), thereby easily holding the cooling pipe (15) between the leaf spring member (80) and the refrigerant jacket (70). Specifically, the cooling pipe (15) is interposed between the leaf spring member (80) and the refrigerant jacket (70) with the front panel (41) being detached from a body of a casing (40). In such a state, the user reaches his hand to the rear of the cooling pipe (15), and then inserts the keys (123) of the lever fastener (120) into the key grooves (104). Subsequently, the rod (121) is rotated about the axis thereof with the lever (122) being gripped. As a result, the keys (123) are fitted and held inside the circular cylindrical groove (105) (see FIG. 11).

Figure 13:
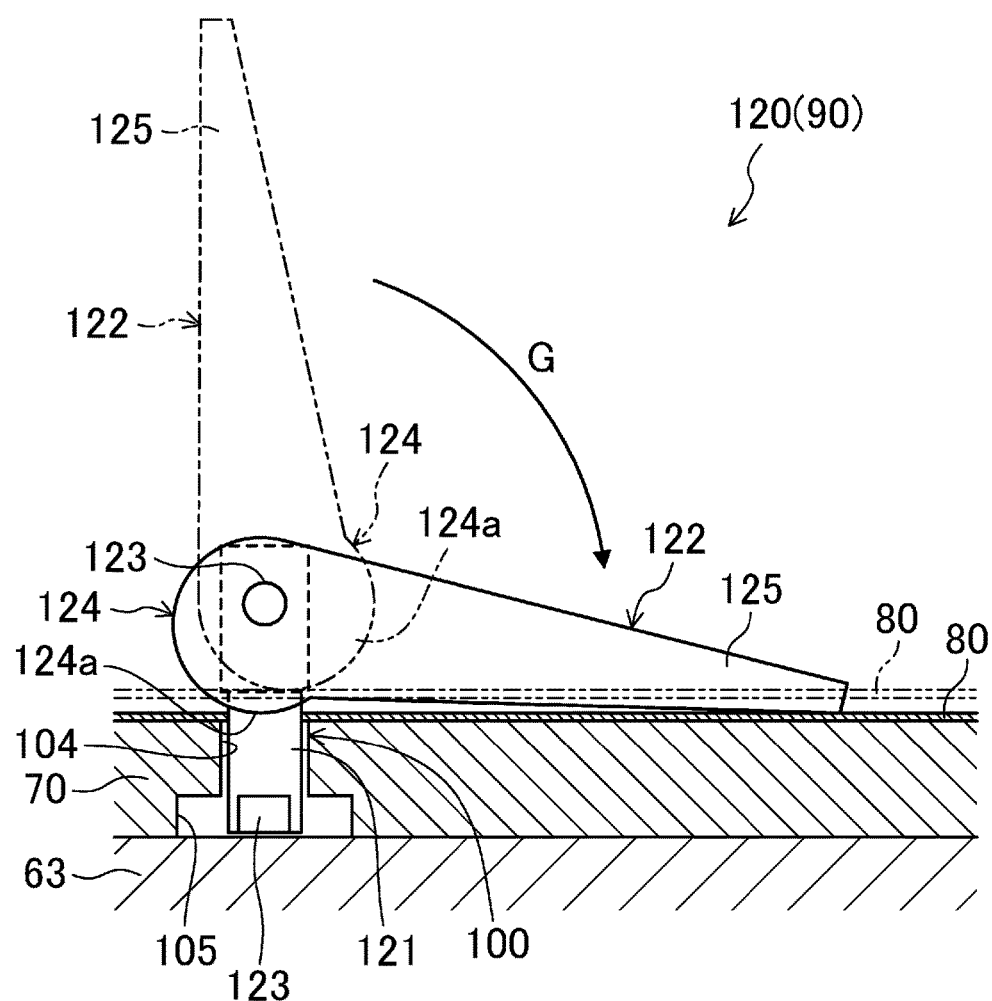
FIG. 13 is a cross-sectional view along an F-F line illustrated in FIG. 11.

Then, while the lever (122) in the state indicated by the two-dot chain line in FIG. 13 is being inclined in a direction indicated by an arrow G in FIG. 13, the protruding arc-shaped part (124a) is gradually pushing an attachment plate part (84) of the leaf spring member (80). Accordingly, pipe-facing parts (82) are elastically deformed toward the cooling pipe (15) as in the second embodiment. As a result, the cooling pipe (15) is held between the leaf spring member (80) and the refrigerant jacket (70).

In order to release the leaf spring member (80), the lever (122) is rotated in a direction opposite to the direction indicated by the arrow G in FIG. 13. This detaches the protruding arc-shaped part (124a) from the attachment plate part (84), thereby releasing the attachment plate part (84).

In the third embodiment, the lever (122) is operated to easily attach the lever fastener (120) to the refrigerant jacket (70). Thus, as in the second embodiment, the degree of freedom of layout of a power conversion device (60) and the cooling pipe (15) can be improved. As a result, the power conversion device (60) can be, as in the second embodiment, disposed in the front of the cooling pipe (15), and component replacement and maintenance of the power conversion device (60) are facilitated.

<<Fourth Embodiment of the Invention>>

Figure 15:
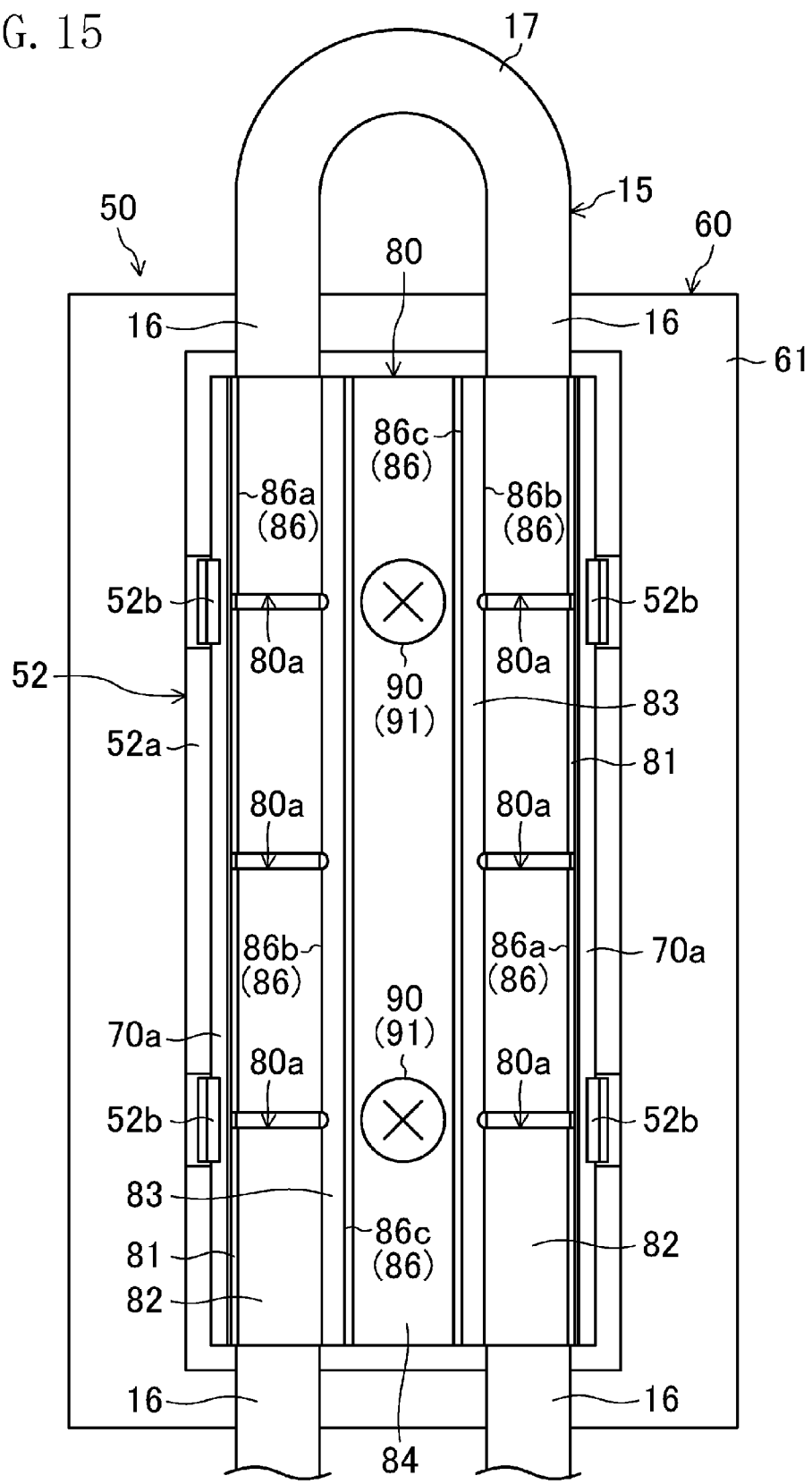
FIG. 15 is a front view of a leaf spring member of a fourth embodiment.

Referring to FIG. 15, slits (80a) may be formed in a leaf spring member (80). In the example of FIG. 15, six slits (80a) are formed. Each slit (80a) is, in a direction perpendicular to straight pipe parts (16) of a cooling pipe (15), formed over an outer plate part (81), a pipe-facing part (82), and an inner plate part (83) of the leaf spring member (80). In this example, the leaf spring member (80) is, at an attachment plate part (84) thereof, pressed against a refrigerant jacket (70) with two screws (91).

An increase in length of the refrigerant jacket (70) in an extension direction of the straight pipe part (16) results in an increase in length of the leaf spring member (80) in the extension direction of the straight pipe part (16). Thus, it is difficult to equalize pressure applied to the straight pipe parts (16) by the leaf spring member (80). On the other hand, since the slits (80a) are formed in the foregoing configuration, it can be ensured that the leaf spring member (80) is along the straight pipe parts (16). Thus, pressure applied to the straight pipe parts (16) by the leaf spring member (80) can be easily equalized. As a result, heat transfer between the cooling pipe (15) and the refrigerant jacket (70) can be further ensured.

Note that the shape of the slit (80a) as illustrated in FIG. 15 has been set forth as an example. Moreover, the number of slits (80a) and the number of screws (91) have been also set forth as examples.

<<Fifth Embodiment of the Invention>>

Figure 16:
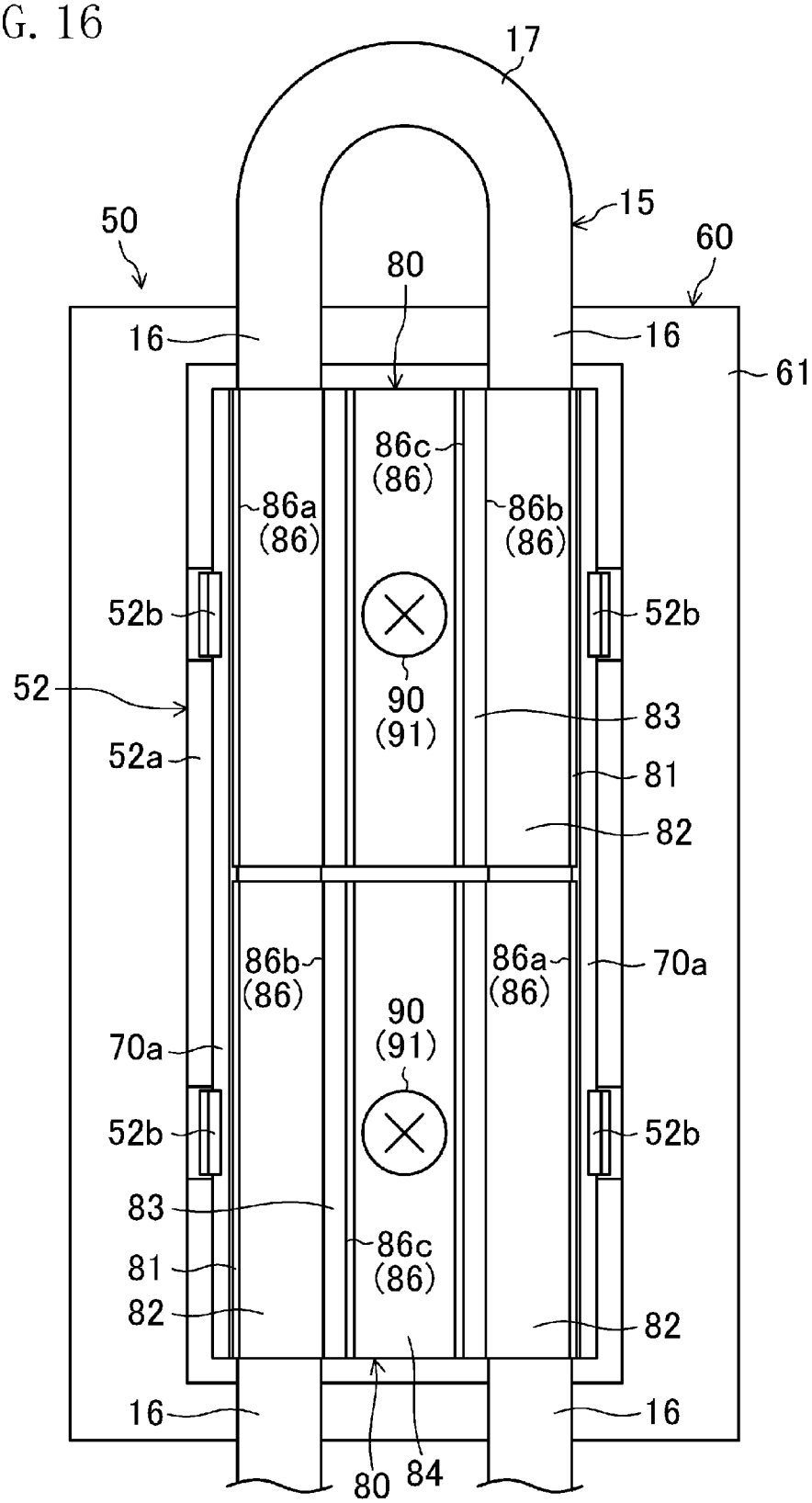
FIG. 16 is a front view of a leaf spring member of a fifth embodiment.

Referring to FIG. 16, a plurality of leaf spring members (80) may be provided for a single refrigerant jacket (70). In this example, two leaf spring members (80) are provided for a single refrigerant jacket (70) so as to be arranged in an extension direction of a straight pipe part (16). Each leaf spring member (80) is, at an attachment plate part (84) thereof, pressed against the refrigerant jacket (70) with a screw (91). In such a configuration, even if the refrigerant jacket (70) is formed so as to be elongated in the extension direction of the straight pipe part (16), pressure applied to the straight pipe parts (16) by the leaf spring members (80) can be easily equalized. Thus, heat transfer between a cooling pipe (15) and the refrigerant jacket (70) can be further ensured.

Note that the number of leaf spring members (80) is not limited to two. The number of leaf spring members (80) may be optionally determined depending on, e.g., the size of the refrigerant jacket (70).

<<Sixth Embodiment of the Invention>>

Figure 17A:
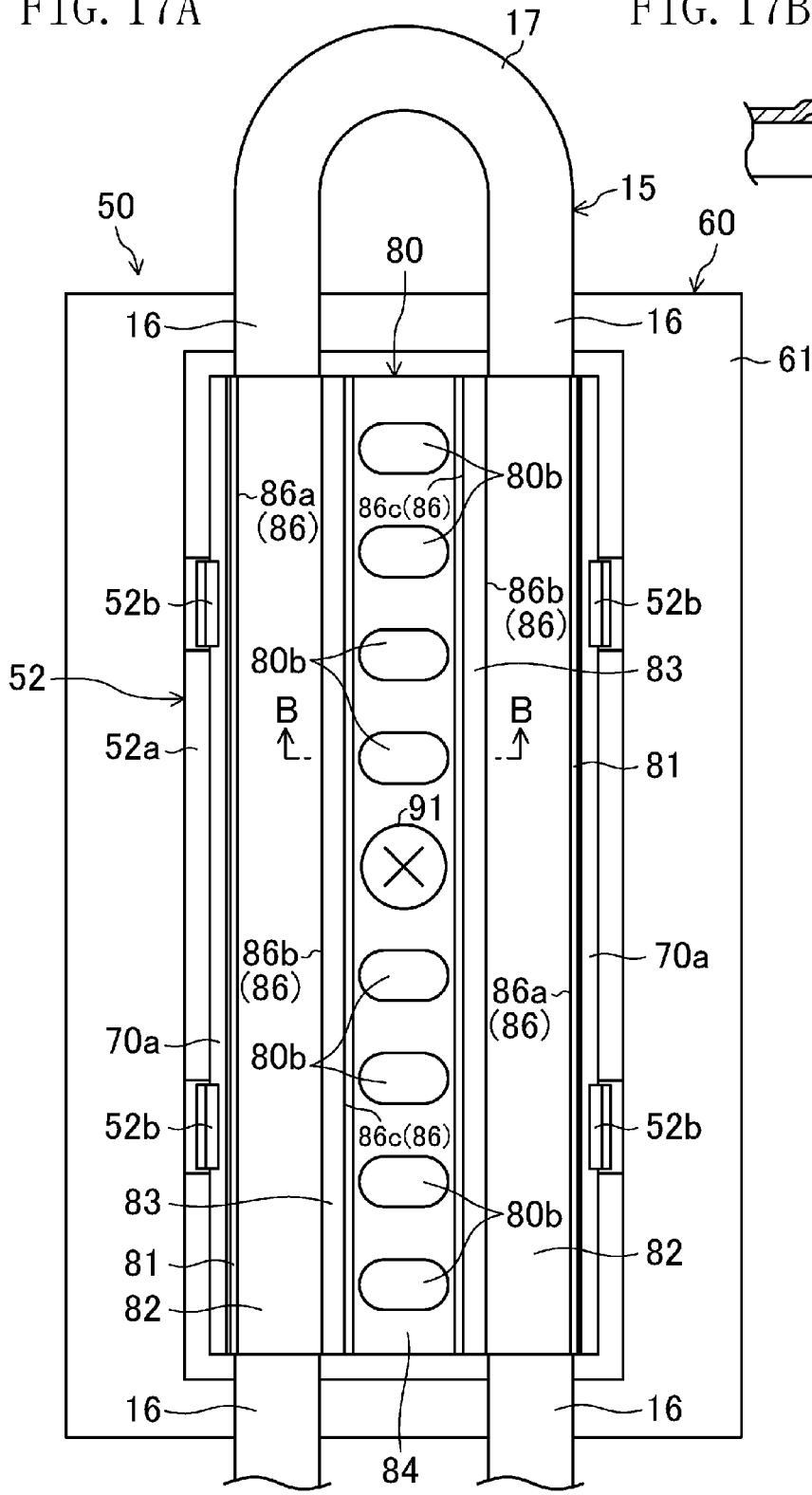
FIG. 17(A) is a front view of a leaf spring member of a sixth embodiment.
Figure 17B:
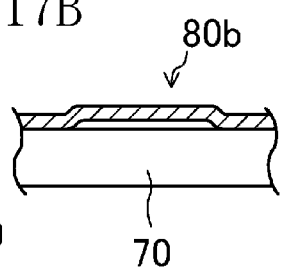
FIG. 17(B) is a cross-sectional view of a reinforcement bead.

Referring to FIGS. 17(A) and 17(B), reinforcement beads (80b) may be formed in a leaf spring member (80). The reinforcement beads (80b) are formed in the vicinity of part (attachment plate part (84)) of the leaf spring member (80) fixed with a screw (91). In the example of FIG. 17(A), eight reinforcement beads (80b) are formed in the attachment plate part (84) so as not to be positioned corresponding to a screw hole (75). Each reinforcement bead (80b) has a substantially oval planar shape, and is formed in the attachment plate part (84) of the leaf spring member (80). Each reinforcement bead (80b) is formed by beading (forming embosses or projections) of the attachment plate part (84), and protrudes in a direction opposite to the refrigerant jacket (70) (see FIG. 17(B)).

For example, in the case where the leaf spring member (80) is thin, there is a possibility that the stiffness of the leaf spring member (80) is insufficient and sufficient force for pressing straight pipe parts (16) cannot be obtained. In order to prevent such a state, the thickness of the leaf spring member (80) may be increased. However, this results in a cost increase and unavailability of a material having a desired thickness. On the other hand, since the reinforcement beads (80b) are formed only in a middle part (attachment plate part (84)) of the leaf spring member (80) in the present embodiment, stiffness is increased only at the middle part of the leaf spring member (80), and therefore the leaf spring member (80) has increased stiffness, as well as possessing spring properties. Thus, sufficient force for pressing the straight pipe parts (16) can be obtained.

<<Seventh Embodiment of the Invention>>

Figure 18:
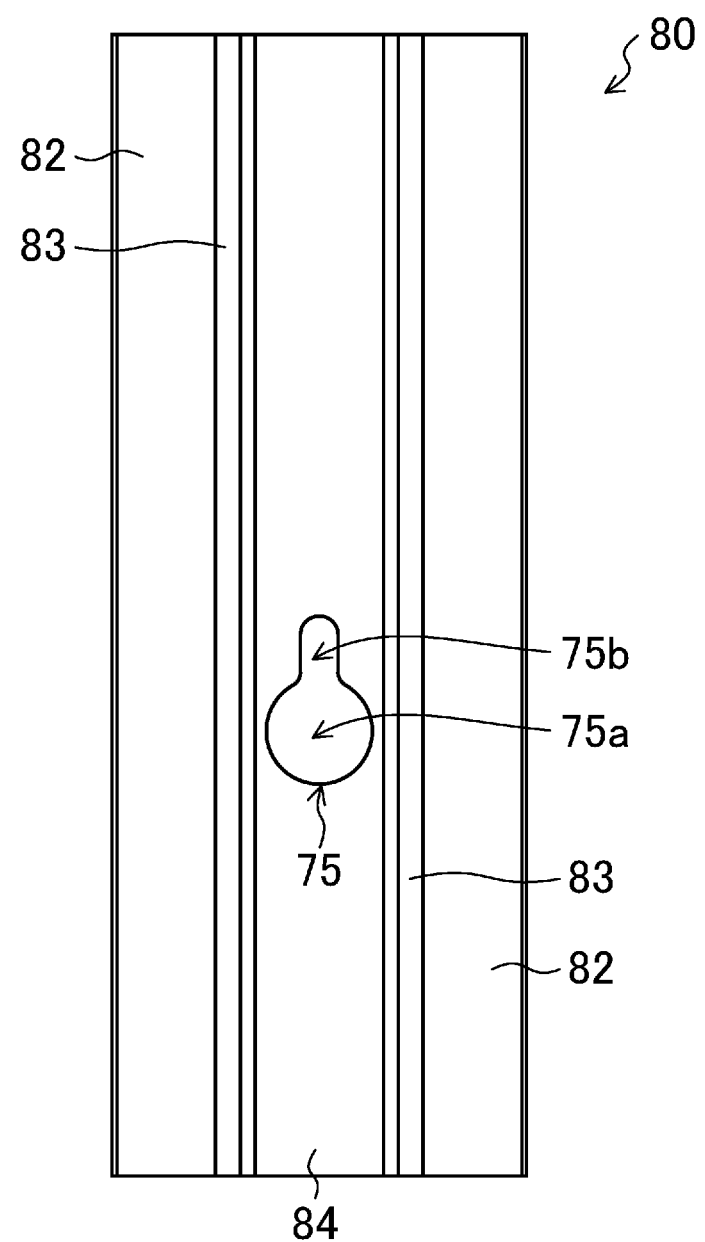
FIG. 18 is a view illustrating another configuration of a screw hole.
Figure 19:
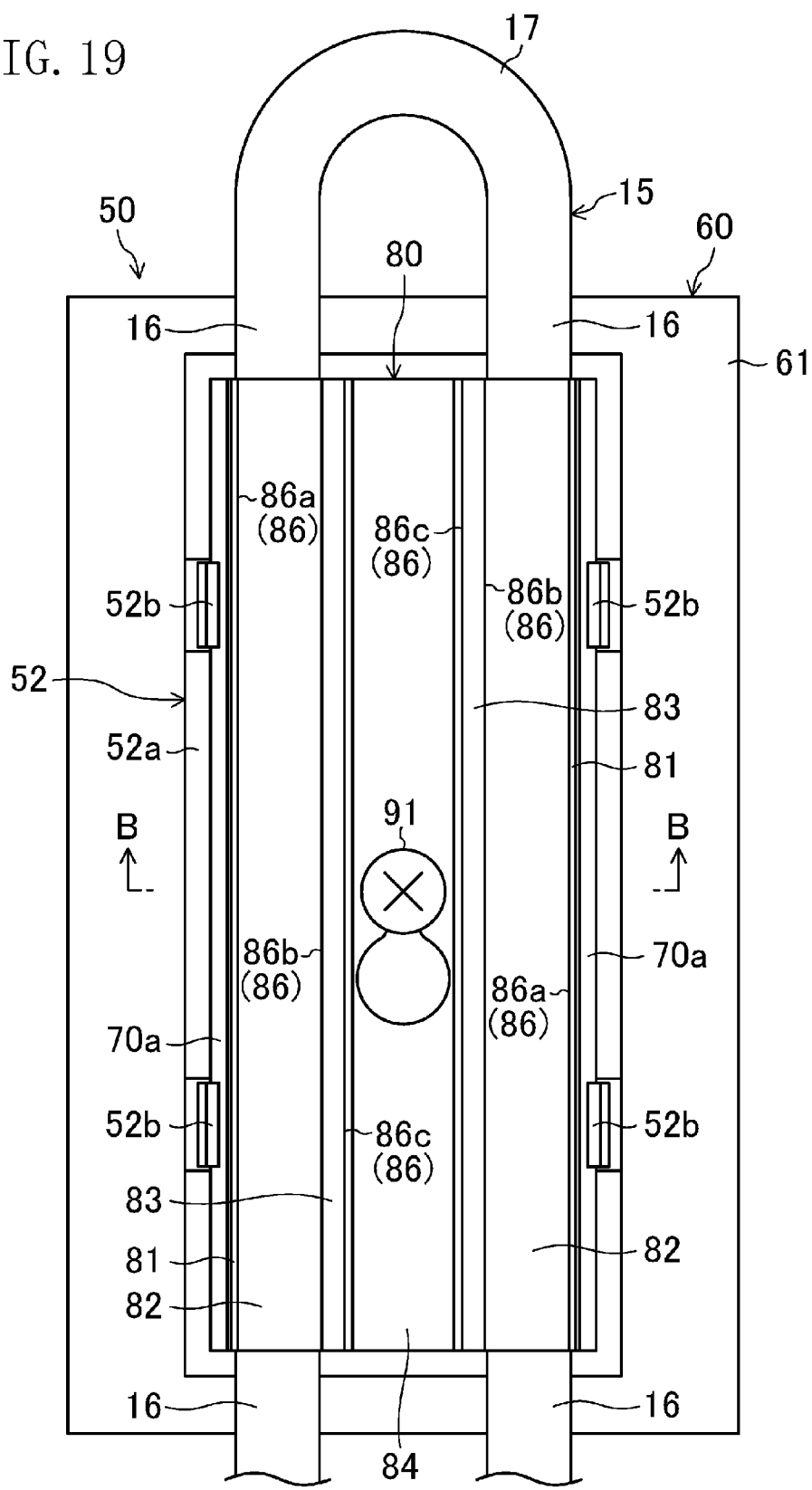
FIG. 19 is a view illustrating the state in which a leaf spring member illustrated in FIG. 18 is attached.

FIG. 18 is a view illustrating another configuration of a screw hole (75). FIG. 19 is a view illustrating the state in which a leaf spring member (80) illustrated in FIG. 18 is attached. In the present embodiment, a single screw hole (75) is, referring to FIG. 18, formed in the leaf spring member (80). The screw hole (75) is in a composite shape of a large diameter part (75a) through which a head of a screw (91) passes and a small diameter part (75b) having such a size that the screw (91) can be tightened.

For screw tightening of the leaf spring member (80), it is necessary to hold one hand against the leaf spring member (80) and to tighten, with the other hand, the screw (91) using a driver with the screw (91) being inserted into the screw hole (75). Thus, screw tightening is difficult. On the other hand, since the shape of the screw hole (75) as described in the present embodiment is employed, assembly may be realized in, e.g., steps illustrated in FIG. 20.

Figure 20:
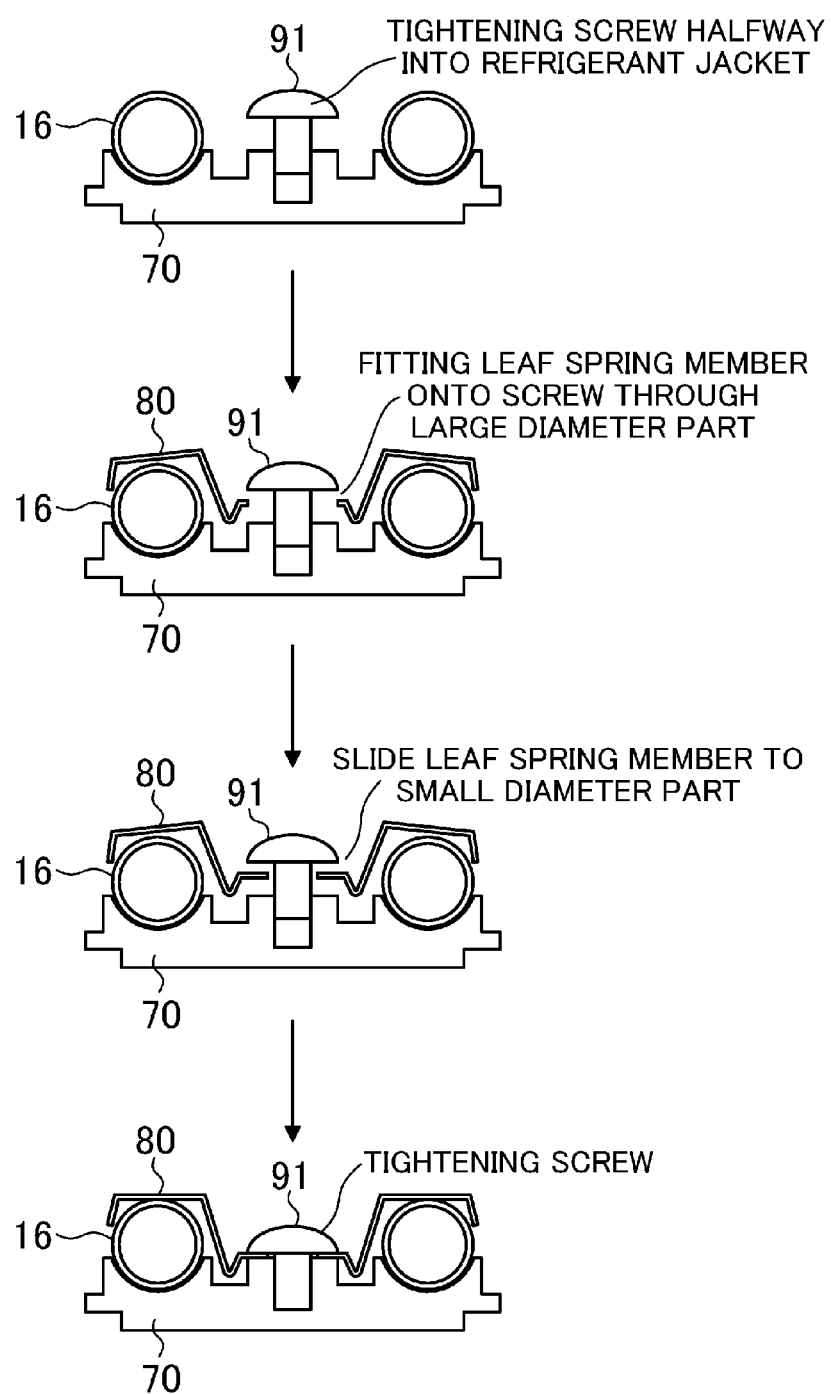
FIG. 20 is a view illustrating steps of attaching the leaf spring member.

In the example of FIG. 20, the screw (91) is first tightened halfway into a refrigerant jacket (70). Then, the leaf spring member (80) is fitted onto the screw (91) through the large diameter part (75a) of the screw hole (75), and then the attachment plate part (84) is slid such that the small diameter part (75b) reaches the screw (91). Subsequently, the screw (91) is tightened using a driver. Since the leaf spring member (80) can be temporarily fixed as described above, the screw (91) can be easily tightened.

<<Other Embodiments>>

The foregoing embodiments may have the following configurations.

Figure 14:
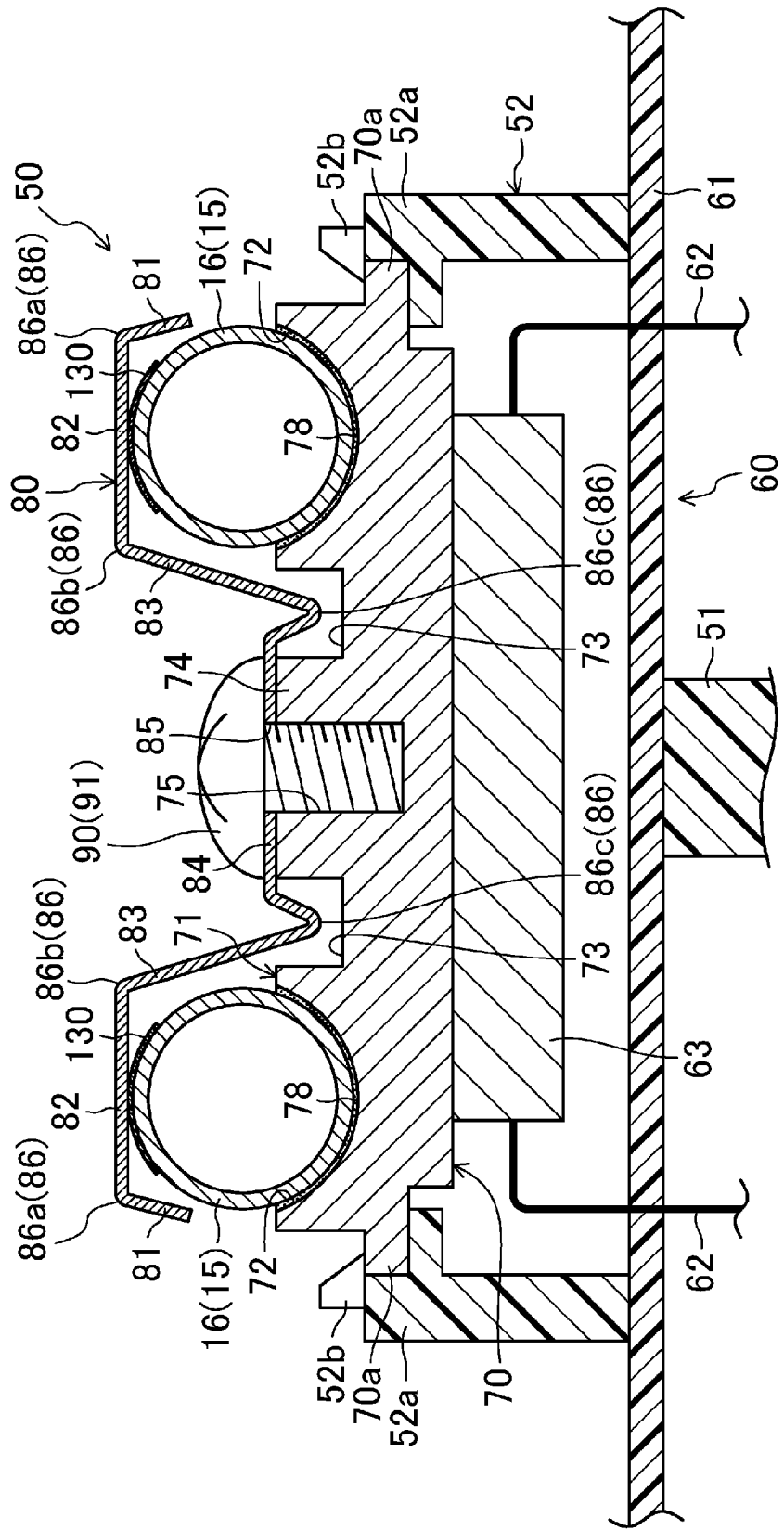
FIG. 14 is a view of an attachment structure of another embodiment, and corresponds to FIG. 2.

In each of the foregoing embodiments, a buffer (130) may be disposed between the cooling pipe (15) and the leaf spring member (80) (see, e.g., FIG. 14). The buffer (130) is made of, e.g., a soft elastic material such as rubber or synthetic resin. The buffer (130) is formed in a sheet shape or a plate shape extending in a longitudinal direction of the cooling pipe (15), and is fixed on a surface of the cooling pipe (15). The buffer (130) equalizes pressing force acting on the cooling pipe (15) from the side close to the leaf spring member (80). Moreover, the buffer (130) prevents direct contact between the cooling pipe (15) and the leaf spring member (80), and prevents corrosion of the leaf spring member (80) and the cooling pipe (15).

In each of the foregoing embodiments, the thermal conductive grease (78) is interposed between the cooling pipe (15) and each pipe groove (72) of the refrigerant jacket (70). However, a thermal conductive sheet may be, instead of the thermal conductive grease (78), used as a heat transfer enhancing material.

In each of the foregoing embodiments, the two pipe grooves (72) are formed in the refrigerant jacket (70), and the cooling pipe (15) is fitted into each pipe groove (72). However, a single pipe groove (72) or three or more pipe grooves (72) may be formed in the refrigerant jacket (70), and the cooling pipe (15) may be fitted into each pipe groove (72). In such a case, the foregoing attachment structure (50) is also employed, and the cooling pipe (15) can be held between the leaf spring member (80) and the refrigerant jacket (70).

In each of the foregoing embodiments, the air conditioner (1) includes the single indoor unit (20) and the single outdoor unit (30) as illustrated in FIG. 1. However, a so-called "multiple-type air conditioner" including a plurality of indoor units (20) and a plurality of outdoor units (30) may be employed. Alternatively, other types of refrigerating apparatuses, such as freezers or water heaters, may be employed.

In each of the foregoing embodiments, refrigerant of the high-pressure liquid line flows into the cooling pipe (15). However, refrigerant of a high-pressure gas line, a low-pressure liquid line, or a low-pressure gas line may flow into the cooling pipe (15).

In each of the foregoing embodiments, the power element (63) of the power conversion device (60) is provided as the cooling target. However, other types of switching elements or electric components may be provided as cooling targets.

INDUSTRIAL APPLICABILITY

As described above, the present disclosure is useful for the refrigerant pipe attachment structure in the cooling structure for cooling the cooling target with refrigerant flowing through the refrigerant pipe.

DESCRIPTION OF REFERENCE CHARACTERS

15 Cooling Pipe (Refrigerant Pipe)
70 Refrigerant Jacket (Heat Transfer Member)
72 Pipe Groove (Groove)
78 Thermal Conductive Grease (Heat Transfer Enhancing Material)
80 Leaf Spring Member (Elastic Member)
82 Pipe-Facing Part
84 Attachment Plate Part (Pressing Target)
86 Bent Part
93 Body (Pressing Part)
94 Gripping Plate (Gripping Part)
96 Protrusion (Engagement Part)
100 Engagement Groove
123 Key (Engagement Part)
124a Protruding Arc-Shaped Part (Pressing Part)
125 Lever Body (Gripping Part)

The invention claimed is:

1. A refrigerant pipe attachment structure comprising:
a heat transfer member formed with two elongated grooves into which a respective pipe of a pair of refrigerant pipes are fitted so as to thermally contact a cooling target;
an elastic member formed in an elongated plate shape extending along an extension direction of the refrigerant pipes and including two pipe-facing parts facing the respective refrigerant pipes; and
a pressing mechanism configured to press the elastic member toward the heat transfer member,
the elastic member further includes a pressing target formed between the two pipe-facing parts, with the pressing mechanism pressing the pressing target at a location between the two pipe-facing parts, wherein
the heat transfer member includes a pair of recesses, each of the recesses extending along the extension direction of the refrigerant pipes between a central portion of the heat transfer member against which the pressing target is pressed and a respective one of the elongated grooves, and
the elastic member includes a pair of bent parts, each bent part protruding into a respective recess of the pair of recesses as a reinforcement rib extending along the extension direction of the refrigerant pipes.

2. The refrigerant pipe attachment structure of claim 1, wherein the pipe-facing parts of the elastic member are formed in a flat plate shape.

3. The refrigerant pipe attachment structure of claim 2, wherein
the elastic member is formed in a single plate shape extending over the grooves.

4. The refrigerant pipe attachment structure of claim 2, wherein
a heat transfer enhancing material configured to enhance heat transfer is interposed between the grooves of the heat transfer member and the respective refrigerant pipes.

5. The refrigerant pipe attachment structure of claim 2, wherein
an engagement groove is formed in the heat transfer member, and
the pressing mechanism includes
an engagement part detachably engaged with the engagement groove,
a displaceable gripping part disposed outside the elastic member, and
a pressing part which is, by displacement of the gripping part, displaceable between a first position at which the elastic member is pressed and a second position at which the elastic member is released.

6. The refrigerant pipe attachment structure of claim 2, wherein
a slit is formed in the elastic member.

7. The refrigerant pipe attachment structure of claim 2, wherein
a reinforcement bead is formed in a vicinity of part of the elastic member pressed against the pressing mechanism.

8. The refrigerant pipe attachment structure of claim 1, wherein the elastic member is formed in a single plate shape extending over the grooves.

9. The refrigerant pipe attachment structure of claim 1, wherein
a heat transfer enhancing material configured to enhance heat transfer is interposed between the grooves of the heat transfer member and the respective refrigerant pipes.

10. The refrigerant pipe attachment structure of claim 1, wherein
an engagement groove is formed in the heat transfer member, and
the pressing mechanism includes
an engagement part detachably engaged with the engagement groove,
a displaceable gripping part disposed outside the elastic member, and
a pressing part which is, by displacement of the gripping part, displaceable between a first position at which the elastic member is pressed and a second position at which the elastic member is released.

11. The refrigerant pipe attachment structure of claim 1, wherein a slit is formed in the elastic member.

12. The refrigerant pipe attachment structure of claim 1, wherein
a reinforcement bead is formed in a vicinity of part of the elastic member pressed against the pressing mechanism.

13. The refrigerant pipe attachment structure of claim 1, wherein
the pressing mechanism is a screw, and
a screw hole having a composite shape of a large diameter part through which a head of the screw passes and a small diameter part having such a size that the screw can be tightened is formed in the elastic member.

* * * * *